(12) United States Patent
Yoshino et al.

(10) Patent No.: US 6,180,868 B1
(45) Date of Patent: *Jan. 30, 2001

(54) SOLAR CELL MODULE, SOLAR CELL MODULE STRING, SOLAR CELL SYSTEM, AND METHOD FOR SUPERVISING SAID SOLAR CELL MODULE OR SOLAR CELL MODULE STRING

(75) Inventors: Takehito Yoshino; Tsutomu Murakami, both of Nara; Koji Tsuzuki, Ikoma; Yoshifumi Takeyama, Kyoto-fu; Koichi Shimizu, Kyotanabe, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/332,104

(22) Filed: Jun. 14, 1999

(30) Foreign Application Priority Data

Jun. 12, 1998 (JP) .................................................. 10-179811
Jun. 8, 1999 (JP) .................................................. 11-161558

(51) Int. Cl.$^7$ ..................................................... H01L 25/00
(52) U.S. Cl. ............................................................. 136/244
(58) Field of Search ............................................... 136/244

(56) References Cited

FOREIGN PATENT DOCUMENTS

| 60-148172 | 8/1985 | (JP) . |
|---|---|---|
| 61-41261 | 3/1986 | (JP) . |
| 6-27964 | 4/1994 | (JP) . |
| 7-26849 | 5/1995 | (JP) . |
| 8-204220 | 8/1996 | (JP) . |
| 9-97918 | 4/1997 | (JP) . |

*Primary Examiner*—Mark Chapman
(74) *Attorney, Agent, or Firm*—Fitzpatrick, Cella, Harper & Scinto

(57) ABSTRACT

A solar cell module or a solar cell module which is provided with a readable and writable memory medium capable of writing in a large quantity of information of said solar cell module and capable of reading out necessary information from said memory medium. A solar cell system comprising said solar cell module or said solar cell module string. A method for supervising said solar cell module or said solar cell module string.

30 Claims, 19 Drawing Sheets

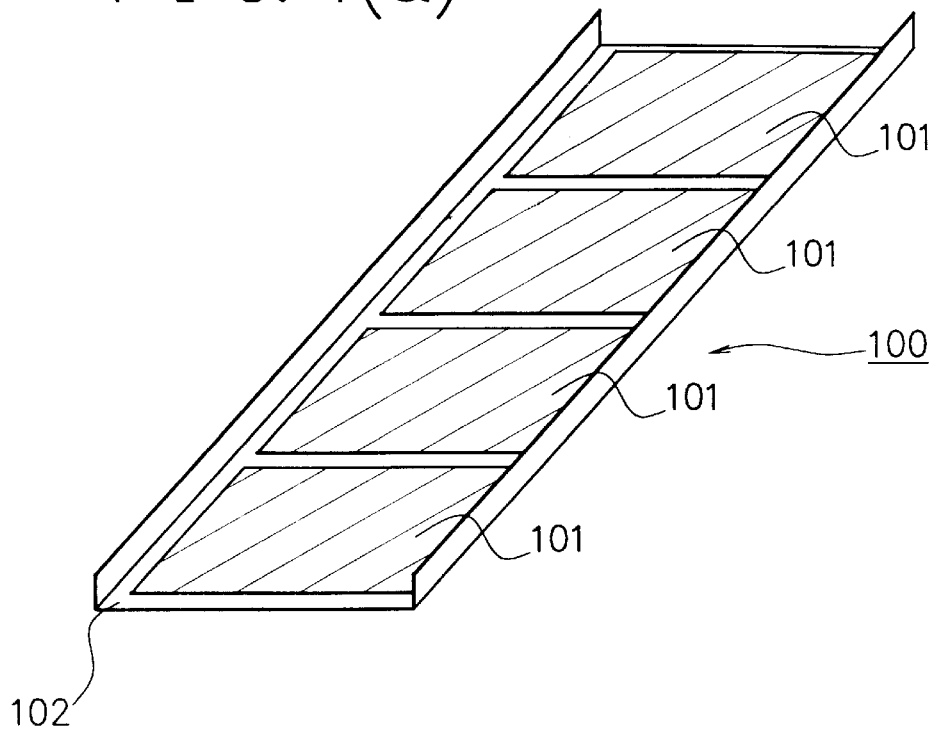
F I G. 1(a)
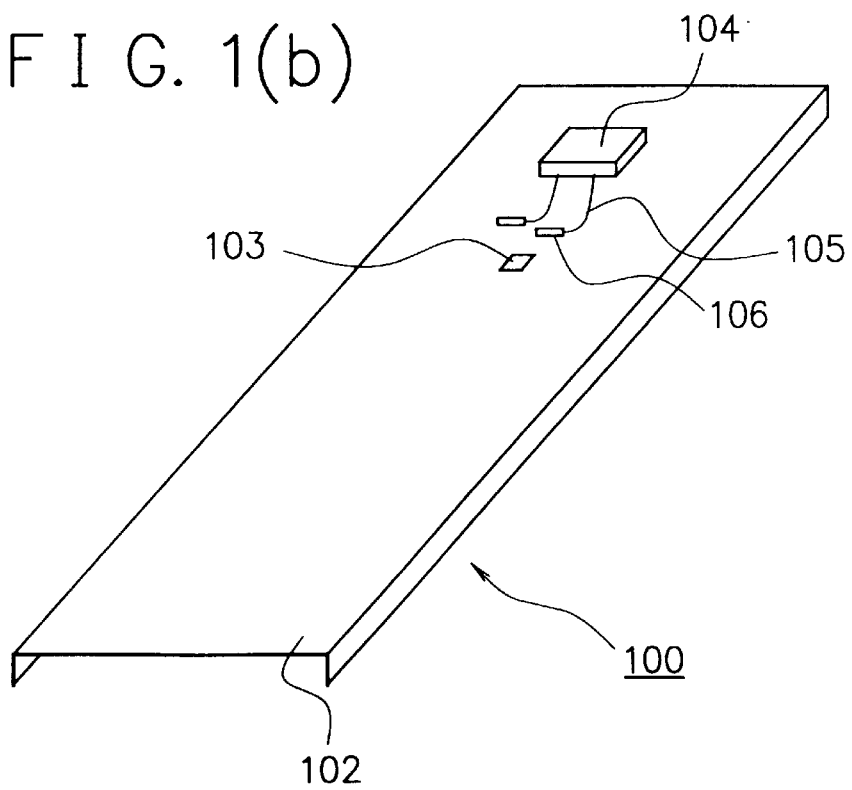
F I G. 1(b)

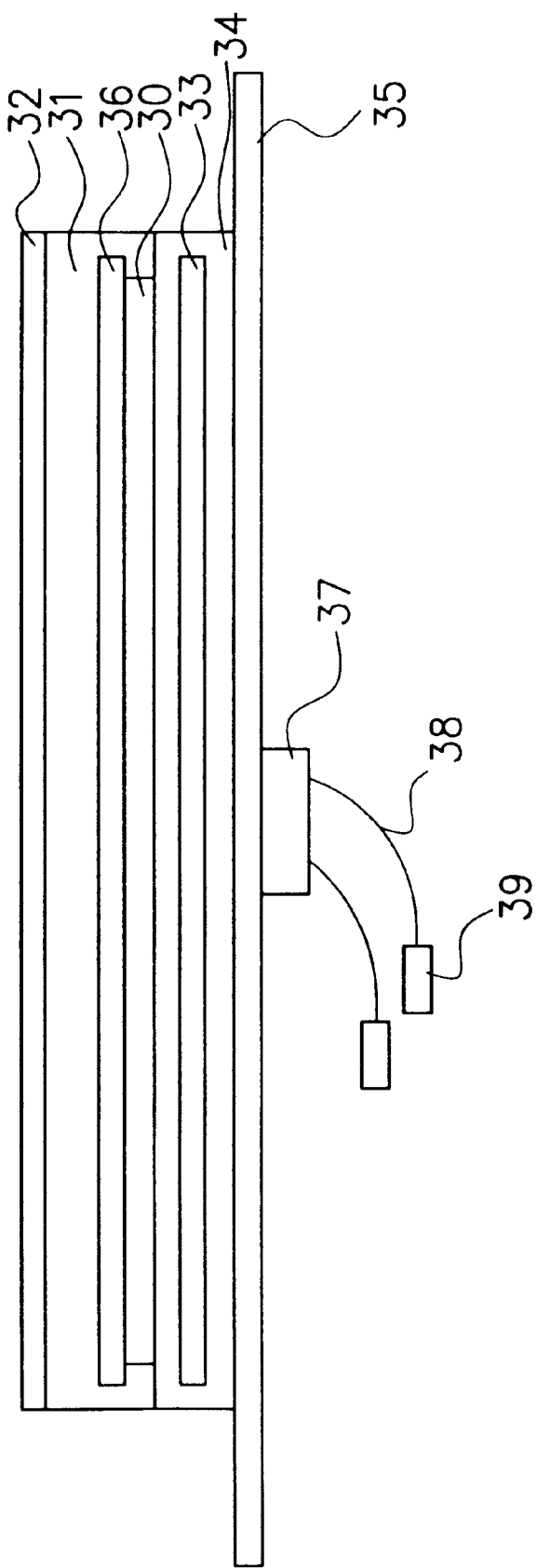

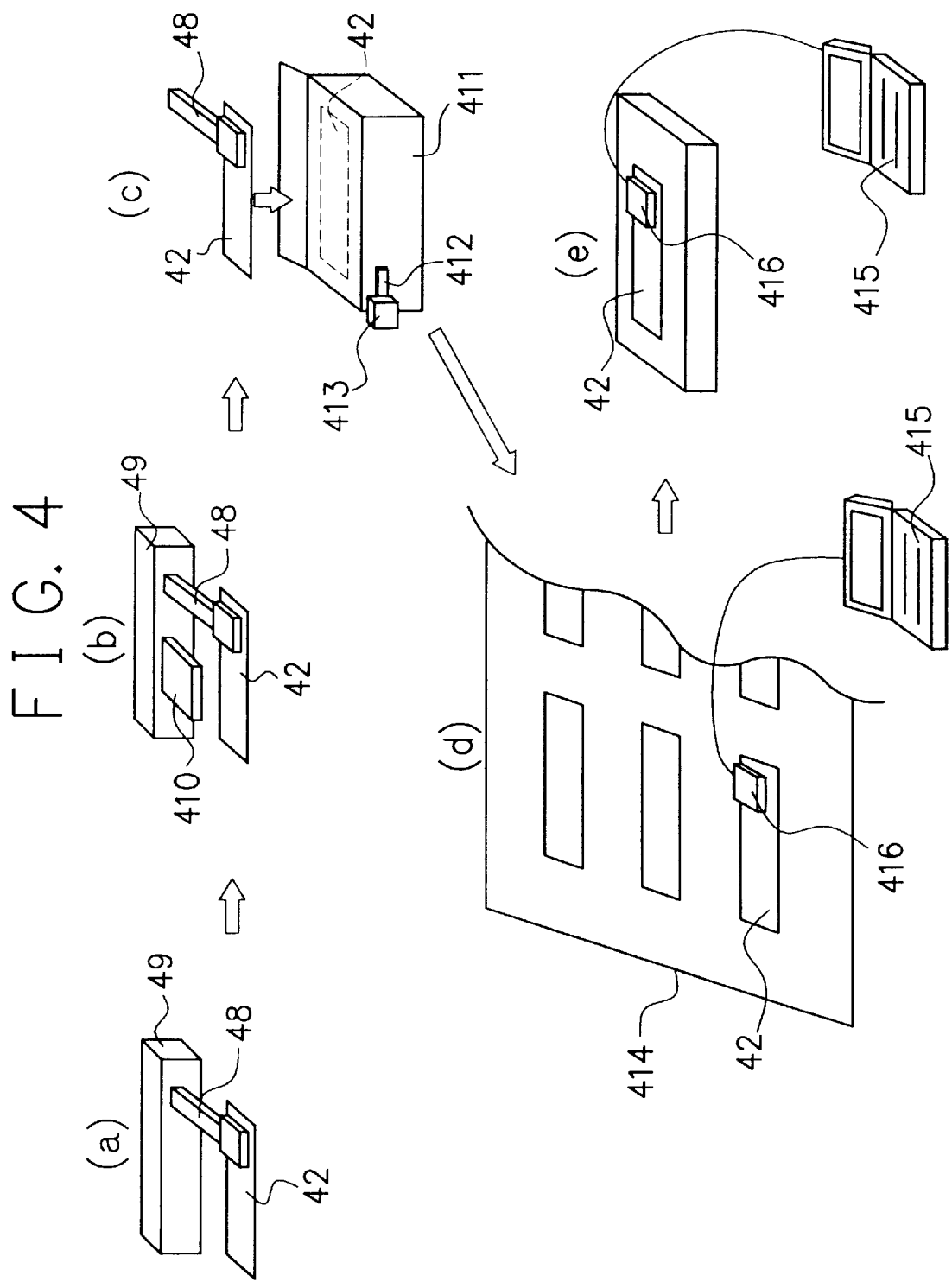

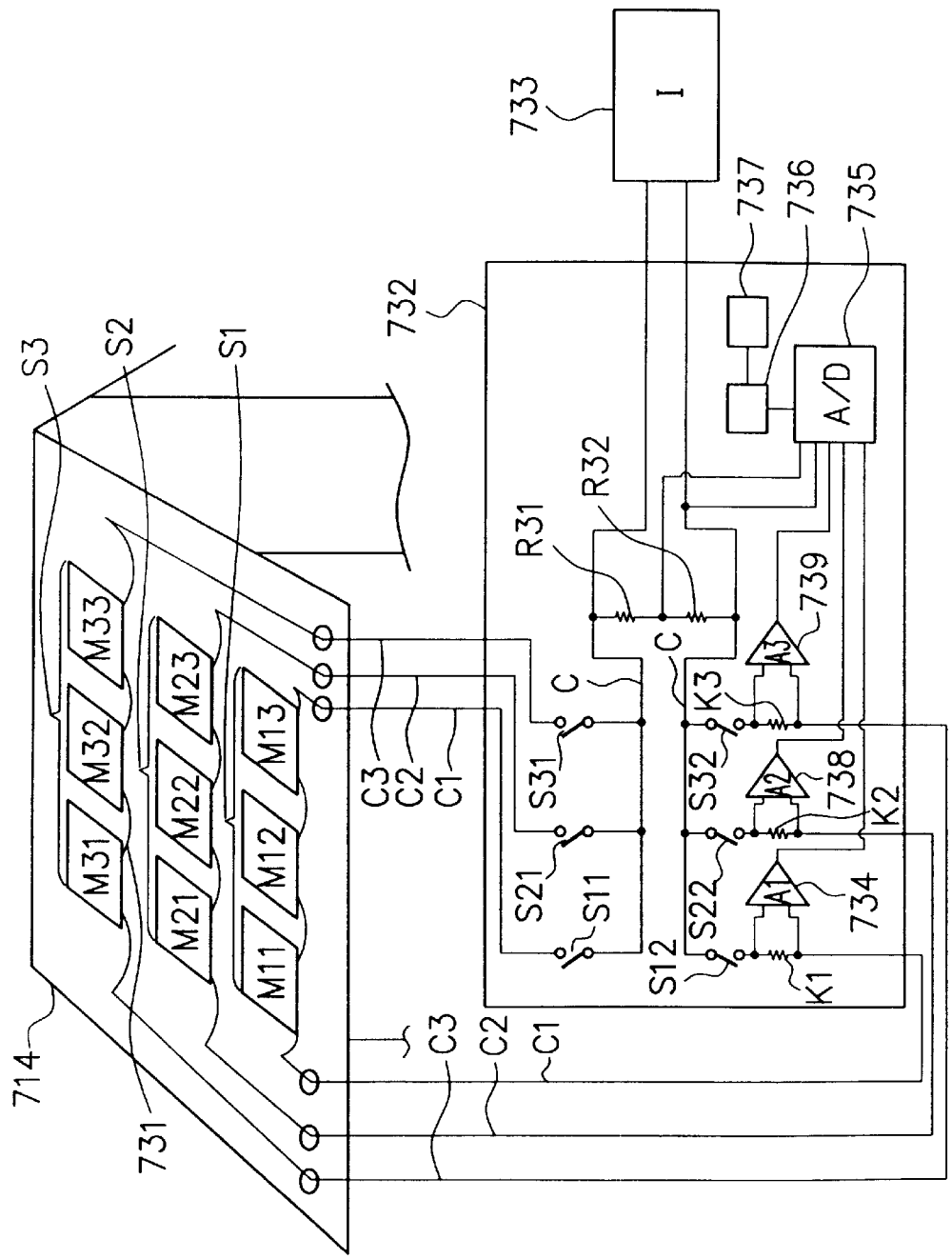

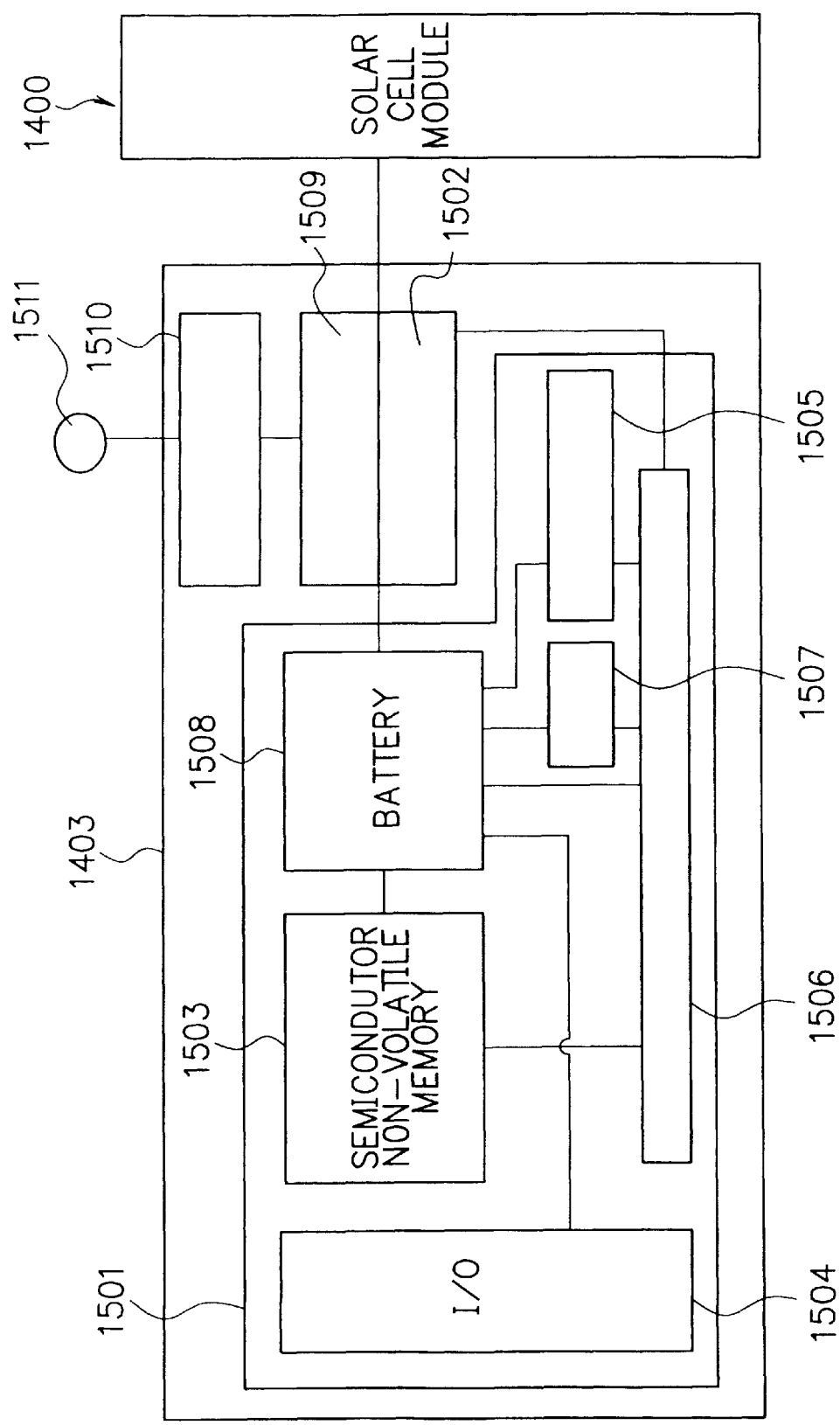

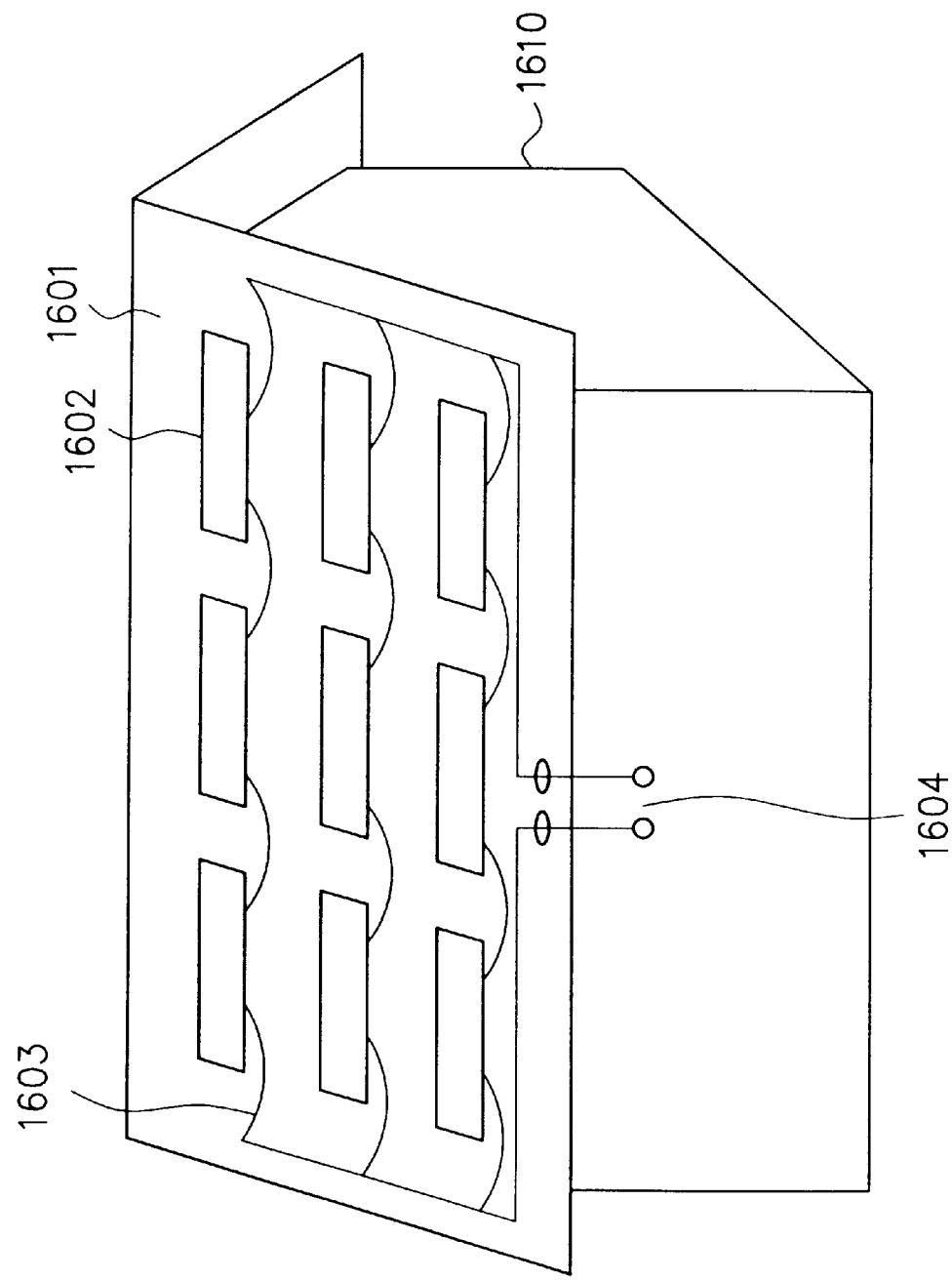

SOLAR CELL MODULE, SOLAR CELL MODULE STRING, SOLAR CELL SYSTEM, AND METHOD FOR SUPERVISING SAID SOLAR CELL MODULE OR SOLAR CELL MODULE STRING

BACKGROUND OF THE INVENTION

1. Field of the Invention

The present invention relates to a solar cell module having a readable and writable memory medium, a solar cell module string comprising a plurality of solar cell modules and having a readable and writable memory medium, and a solar cell system having said solar cell module or said solar cell module string. The present invention also relates to a method of supervising said solar cell module or said solar cell module string.

2. Related Background Art

In recent years, societal consciousness of the problems relating to the environment and energy has been increasing all over the world. Particularly, heating of the earth because of the so-called greenhouse effect due to an increase of atmospheric $CO_2$ has been predicted to cause a serious problem. In view of this, there is an increased demand for means of power generation capable of providing clean energy without causing $CO_2$ build-up. In this regard, nuclear power generation has been considered advantageous in that it does not cause $CO_2$ build-up. However, there are problems with nuclear power generation such that it unavoidably produces radioactive wastes which are harmful for living things, and there is a probability that leakage of injurious radioactive materials from the nuclear power generation system will occur when the system is damaged. Therefore, there is an increased societal demand for early realization of a power generation system capable of providing clean energy without causing $CO_2$ build-up as in the case of thermal power generation and without causing radioactive wastes and radioactive materials as in the case of nuclear power generation.

There have been various proposals which are expected to meet such societal demand. Among those proposals, solar cells (i.e., photovoltaic elements) are expected to be a future power generation source since they supply electric power without causing those problems as above mentioned, and they are safe and can be readily handled. Particularly, public attention has been focused on a solar cell power generation system because it is a clean power generation system which generates electric power using sunlight. It is also evenly accessible at any place in the world and can attain relatively high power generation efficiency without requiring a complicated large installation. It can also be expected to comply with an increase in the demand for electric power in the future without causing environmental destruction. Various studies have been made in order to realize a desirable solar cell power generation system which is practical as a power supply source.

Incidentally, solar cells have been widely used since they are clean and non-exhaustible electric power sources. Various studies have been made in order to further improve them in terms of their performances. Besides, there have been proposed a variety of solar cell modules comprising a plurality of solar cells (or photovoltaic elements) sealed therein. For these solar cell modules, various studies also have been made in order to further improve them in terms of their performances. Some of these solar cell modules have been put to practical use, for instance, by installing them on the ground or a roof of a building.

In the case of installing a plurality of solar cell modules on a roof of a building, the execution work is usually conducted for every transportation or installation unit comprising a predetermined number of the solar cell modules. The solar cell module herein means a structural body formed by providing a plurality of solar cells, electrically connecting them to each other in series connection or parallel connection to obtain a solar cell array, and sealing said array into a panel-like shape. In the case of installing these solar cell modules on the roof, they are spacedly arranged on the roof at equal intervals, followed by electrically wiring them so that they are electrically connected with each other in series connection or parallel connection. The result of this process is generally called a solar cell module array.

Here, the term "array" is used in the case where both series connection(s) and parallel connection(s) are present. The term "string" is used in the case where only series connection(s) is present. In this respect, in the case of a structural body comprising a plurality of solar cells serialized with each other, the structural body will be hereinafter referred to as "solar cell string". Similarly, in the case of a structural body comprising a plurality of solar cell modules electrically serialized with each other, the structural body will be hereinafter referred to as "solar cell module string".

FIG. 16 is a schematic view illustrating an example of such solar cell module string installed on a roof of a building. As shown in FIG. 16, a plurality of solar cell modules 1602 are spacedly arranged on a roof 1601 of a building 1610. These solar cell modules 1602 each having a pair of positive and negative terminals (not shown) are electrically connected with each other in series connection by electrically connecting their positive and negative terminals by means of wiring cables 1603. The solar cell modules thus electrically serialized establish a solar cell module string. Reference numeral 1604 indicates a pair of cable terminal portions extending from the solar cell module string. The cable terminal portions 1604 are electrically connected to a connection box connected to an inverter (not shown) so that electric power generated by the solar cell module string is supplied into the inverter through the connection box.

In the above, because the electric power generated by the solar cell module string is of DC, the DC power is converted into an AC power by the inverter and then outputted.

The wiring cables 1603 are usually wired on the rear sides of the solar cell module in many cases in order to prevent them from becoming externally conspicuous.

In the configuration shown in FIG. 16, it is possible for the solar cell modules 1602 to be classified into several groups, each comprising a predetermined number of the solar cell modules which are electrically serialized with each other and having a pair of cable terminal portions. These module groups are separately connected to a connection box having a switching mechanism (not shown) and which is connected to an inverter through their cable terminal portions so that electric power generated by a given module group can be selectively supplied into the inverter through the connection box.

FIG. 17(a) is a schematic slant view illustrating a specific example of the configuration of each of the solar cell modules 1602 shown in FIG. 16, when obliquely viewed from the front side. FIG. 17(b) is a schematic cross-sectional view, taken along the line Y-Y' in FIG. 17(a). The solar cell module 1700 shown in FIGS. 17(a) and 17(b) is a roof-integral type solar cell module which also functions as a roofing material. Particularly, the solar cell module 1700 is suitable for use in batten seam roofing.

Description will be made of the structure of the solar cell module 1700 with reference to FIGS. 17(*a*) and 17(*b*). The solar cell module comprises a plurality of solar cells 1701 spacedly arranged on a flat face of a reinforcing plate 1740 whose opposite long edge side end portions are bent upward at 90° on the light receiving face side, where the solar cells 1701 are electrically serialized with each other to establish a solar cell string. Each of the solar cells 1701 comprises a photovoltaic element group 1710 comprising a plurality of photovoltaic elements serialized with each other, where the photovoltaic element group 1710 is sealed by a surface covering material 1720 and a back face covering material 1730. Reference numeral 1750 indicates a terminal box which is provided at the rear face of the reinforcing plate 1740. A pair of power output terminals extending from the solar cell string are drawn through a hole (not shown) formed at a solar cell-free end portion of the reinforcing plate 1740 in the longitudinal direction and connected to the terminal box 1750. Reference numeral 1751 indicates a pair of cables extended from the terminal box 1750. The cables 1751 are electrically connected to the power output terminals from the solar cell string in the terminal box 1750. Each of the cables 1751 is provided with a one-touch system connector 1752. The roof-integral type solar cell module 1700 can electrically connect with another roof-integral type solar cell module (not shown) by connecting the connectors 1752 of the former with those (not shown) of the latter.

The roof-integral type solar cell module 1700 has the opposite long edge side end portions bent upward at 90° in order to make the solar cell module suitable for use in batten seam roofing, where, if necessary, paint is applied to the solar cell module. In the case of practicing batten seam roofing, there are provided a predetermined number of roof-integral type solar cell modules having such configuration as shown in FIGS. 17(*a*) and 17(*b*). They are arranged on a roof of a building in accordance with the batten seam roofing method, and wiring is conducted to electrically connect them so as to comply with a predetermined electric design specification.

By the way, for solar cell modules having such configuration as above described which are manufactured in a factory, there is known a method of supervising them. In particular, a face plate having an inherent identification number is affixed onto a given position of each solar cell module, and when they are inspected and installed and when one or more of them are troubled and repaired, an administrative register or an administrative data base is prepared on the basis of the identification numbers of the face plates affixed on the solar cell modules.

This supervising method will be described in more detail while referring to the embodiment shown in FIG. 16, with reference to FIG. 18.

FIG. 18 is a schematic slant view illustrating one of the cell modules shown in FIG. 16, when such a face plate as above described is affixed onto a given position of the solar cell module. In FIG. 18, reference numeral 1602 indicates said solar cell module having a power generation region 1807 and frame 1805 having a face plate 1806 with an indication of an inherent identification number affixed onto its outer peripheral portion. The position for the face plate 1806 to be affixed is not limited to this. It is possible for the face plate 1806 to be affixed to an appropriate position of the rear face of the solar cell module 1802 or at an appropriate position of the surface of the solar cell module 1802 which is outside the power generation region 1807.

The face plate 1806 may comprise a metal plate or a soft member such as a seal or the like. Affixing the face plate 1806 as above-described may be accomplished with an appropriate fixing manner such as by means of an adhesive, vise, or the like.

As the indication means of the identification number, there can be mentioned, for example, a pattern with a printed serial number, a pattern with a bar-coded serial number, a pattern with a coded serial number, and the like. Besides, there can be mentioned such identification manners as described in Japanese registered utility model publication No. Sho.61-41261/1986 and Japanese patent publication No. Hei.5-38464/1993.

The foregoing information described in the face plate includes the type, rating, administrative number, or the like of a solar cell module. In the case where there is a large deal of information which cannot be entirely described in the face plate, it is possible to store information (particular management information) other than that described in the face plate for a given solar cell module in an information storage means, and when required, the information described in the face plate is verified with the particular management information stored in the information storage means.

The information storage means herein means an administrative register or an administrative data base comprising a computer or the like.

The particular information stored in the information storage means includes details of a given solar cell module such as the production date, the production place (factory), the production condition, the position to be installed, the constituents, the electrical performance, and the like. The information of the solar cell module such as the type, rating, administrative number and the like described in the face plate is sometimes stored in the information storage means such as the administrative data base.

The foregoing particular information also includes such information as described in the following. That is, for the solar cell module having been shipped as a product from a production factory and installed on a roof of a building, the information of collecting and recycling it is also included. Specifically, this information is meant to include information relating to maintenance, inspection, repair, recovery, removal and the like for the solar cell module installed on the roof.

In the case of obtaining necessary information for a given solar cell module from the administrative register or the administrative data base, a worker first obtains the information of the administrative number or the like described in the face plate affixed to the solar cell module. On the basis of the information obtained, the corresponding necessary information is selected from a large amount of particular information stored in the information storage means, and reference is made to the information thus selected.

It is possible to select a specific solar cell module from a plurality of solar cell modules by obtaining necessary information therefor from the information storage means and collating the information obtained with the information described in the face plates of the solar cell modules.

Now, in the case where a plurality of solar cells installed on a roof of a building are used over a long period of time, one or more of them are occasionally damaged with respect to their front surface by flying matter due to strong wind caused by a storm or the like. Such damaged solar cell module is occasionally desired to be replaced by a new solar cell module in view of security. In that case, prior to the replacement, the type, connector form and the like of the damaged solar cell module are ascertained on the basis of the administrative information described in the face plate affixed thereto. Then, a new solar cell module corresponding to the damaged solar cell module is provided, followed by replacing the damaged solar cell module by the new solar cell module.

In the case of obtaining the administrative information from the face plate affixed to the damaged solar cell module, a worker involved removes other solar cell modules situated around the damaged solar cell module. This method is problematic. Specifically, problems are encountered in the case where a number of solar cell modules, each having a face plate with such administrative information as above described which is affixed to the rear face or side face, are installed on the roof in accordance with the batten seam roofing method, one solar cell situated at a central position has been damaged, and the damaged solar cell module must be replaced. In order to obtain the administrative information described in the face plate affixed to the damaged solar cell module, the solar cell modules circumscribing the damaged solar cell module must be sequentially removed until the damaged solar cell module, and the administrative information described in the face plate affixed thereto, is ascertained. In this case, such problems as will be described in the following are entailed. The roof is kept in a partially demolished state until the type, connector form and the like of the damaged solar cell module are ascertained on the basis of the administrative information described in the face plate affixed thereto, a new solar cell module corresponding to the damaged solar cell module is provided, and the damaged solar cell module is replaced by the new solar cell module. In addition, after the roof is restored by replacing the damaged solar cell module by the new solar cell module, it is possible that ceratain defects could have been created, whereby rain may invade the roof structure.

Separately, such information as above described which is stored in the information storage means is intended to remain on each solar cell module. It is therefore necessary to provide a plurality of face plates at the solar cell module. But this is not practical. For instance, considering all the possible solar cell module scenarios when the solar cell module is inspected, a face plate containing information of its date and the result is affixed to the solar cell module; when the solar cell module is installed, a face plate containing information of its date, the installation place and the owner is affixed to the solar cell module, and when the solar cell module is troubled and repaired, a face plate containing information of the repair date, the troubled content and the repair result is affixed to the solar cell module. However, in this manner, it is necessary to affix an appropriate face plate to a given solar cell module for every action it undergoes. Accordingly, the number of face plates affixed to the solar cell module successively increases. Hence, this manner is complicated and difficult to efficiently practice. Thus, this method is impractical.

Incidentally, there have been proposed many techniques of disposing indication means contrived with respect to a character, designation, color or form at a light receiving face side of a solar cell module so that the solar cell module can be identified in accordance with an indication by the indication means.

These techniques are described, for instance, in the following documents.

Japanese registered utility model publication No. Sho.61-41261/1986 (hereinafter referred to as Document 1) discloses a solar cell (that is, a solar cell module) having a configuration in which a penetration pattern of a desired character, designation or the like is provided in the semiconductor layer forming the photoelectric conversion region. The penetration pattern is filled by an insulating material having a desired color, and said character, designation or the like is realized due to a difference between the color of the semiconductor layer and that of the insulating material.

Japanese patent publication No. Hei.5-38464/1993 (hereinafter referred to as Document 2) discloses a colored solar cell module which does not have a non-power generation region. Particularly, the solar cell module of Document 2 has a configuration in which a color filter and a color diffusing layer are disposed on the front face of a solar cell element. The color filter is capable of transmitting light having a wavelength matched to the power generation spectrum of the solar cell element, and the color diffusing layer comprises a light scattering layer capable of transmitting a part of the light transmitted by the color filter and scattering the residual light.

Japanese registered utility model publication No. Hei.6-27964/1994 (hereinafter referred to as Document 3) discloses a solar cell module having a configuration in which a solar cell element and a colored light scattering reflector are arranged in a mosaic state so that a desired character, designation or the like is realized by virtue of the colored light scattering reflector.

Japanese registered utility model publication No. Hei.7-26849/1995 (hereinafter referred to as Document 4) discloses a translucent thin film solar cell having a stacked body comprising a transparent electrode, an amorphous silicon layer and a metal layer formed on a translucent insulating substrate, wherein an identification pattern comprising said stacked body is provided at a portion other than the solar cell-forming portion.

Unexamined Japanese patent publication No. Hei.8-204220/1996 (hereinafter referred to as Document 5) discloses a solar cell module which has a power generation layer having an uneven surface provided with an irregular structure distribution such that the direction of incident light reflected varies depending on a position on the surface of the power generation layer to indicate an appropriate pattern.

Unexamined Japanese patent publication No. Hei.9-97918/1997 (hereinafter referred to as Document 6) discloses a solar cell module which has a surface covering material having a pattern indicating means for providing a display pattern of a desired character, designation or design on the light receiving face. The pattern indicating means comprises a patterned surface region capable of forming said display pattern and another patterned surface region having a surface pattern which is different from the former patterned surface region, and the two patterned surface regions are situated next to each other.

However, with respect to such identifying indication means used in solar cell modules as disclosed in the foregoing documents, there are disadvantages such that when certain indication information is installed, it is very difficult to change the information. It is also very difficult to delete the installed indication information and to install additional indication information in addition to the previously installed information.

In addition, there are also disadvantages such that the quantity of information which can be realized by the identifying indication means provided in the solar cell module is limited in view of the external appearance and also in view of an available space in the limited light receiving face. Therefore, the information which can be realized by the identifying indication means is eventually limited to a matter such as the type of the solar cell module, an inherent identification number corresponding to the production serial number of the solar cell module, or an administrative number for the solar cell module. In other words, the identifying indication means can retain only an information quantity to an extent which can be described in the foregoing face plate.

In this respect, for a number of solar cell modules which are installed on a roof of a building, when data (information), e.g., their types, administrative numbers, production dates, ratings, installation places, production condition, constituent materials (including their types, production plants, and administrative numbers), and the like, are stored in an administrative register or a database corresponding to the administrative register, in order to obtain necessary information for one of the solar cells with respect to their histories and the like for the maintenance work, it is necessary to retrieve the supervising register or the database based on the inherent identification number or the like of the solar cell module. Particularly, when information with respect to a specific solar cell module installed on the roof, e.g., inspection date or installation date, is required, it is necessary to refer to the administrative register in any case. In this case, when the solar cell modules installed on the roof are those provided with the foregoing identifying indication means on their light receiving face side, the specific ones can be more easily identified from the external appearance in comparison with the case of identifying a specific solar cell module, each provided with the foregoing face plate at the side face or rear face. This situation, wherein it is easy to locate the specific solar cell module, is not sufficient to efficiently and quickly conduct maintenance.

Specifically, the identifying indication means described in the foregoing documents have such disadvantages as will be described in the following.

Each of the identifying indication means described in Documents 1 and 3 is disposed in the light receiving face of the solar cell module, and it is such that other than the power generation region, the non-power generation region is provided, and a display pattern of a desired character, designation or the like is realized due to a difference between the color of the non-power generation region and that of the power generation region. Thus, there is a disadvantage such that when it is intended to increase the quantity of information to be indicated, it is necessary to increase the indication area for indicating said display pattern. Where the indication area is increased, the proportion of the indication area in the light receiving face is increased accordingly, resulting in a reduction in the power generation efficiency of the solar cell module as much as said proportion is increased.

The identification pattern as the identifying indication means in Document 4 comprises the stacked body which is substantially the same as the stacked body constituting the solar cell. This identification pattern is established by converting a part of a region capable of functioning as a power generation region into a non-power generation region by way of independent treatment by means of etching or the like. The identifying indication means described in Document 4 also has a disadvantage similar to that described in the above. That is, when it is intended to increase the quantity of information to be indicated, it is necessary to diminish the area of the power generation region in the limited area of the light receiving face. This situation results in a reduction in the power generation efficiency of the solar cell.

In order to form a desired character, designation or the like without establishing such non-power generation region as described in the above, it is considered that use of the configuration of the colored solar cell module described in Document 2 will be effective. In this case, there is an idea to modify the configuration of Document 2 such that the color filter (capable of transmitting light having a wavelength matched to the power generation spectrum of the solar cell element) and the color diffusing layer (comprising the light scattering layer capable of transmitting part of the light transmitted by the color filter and scattering the residual light) are disposed on the front face of the solar cell element. To that end, the color filter and color diffusing layer are shaped in a form corresponding to a desired character, designation or the like. This arrangement would form the character, designation or the like due to a difference between the color of the color filter and color diffusing layer and that of the solar cell element. However, in this case, a problem unavoidably occurs in that a remarkable reduction is caused in the power generation because a reflectance of about 30 to 50% and a transmittance of about 60 to 40% for incident light are required in order to offset the lowered power generation efficiency as described in Document 2.

In the case of the solar cell module described in Document 5, in which an appropriate pattern is indicated by varying the direction of incident light reflected depending on a position on the irregularly structured distribution-bearing surface of the power generation layer and also in the case of the solar cell module described in Document 6, in which a display pattern of a desired character, designation or the like is provided in the light receiving face by the two different patterned surface regions having a different pattern which are arranged next to each other in the light receiving face, it is possible to realize an appropriate display pattern while preventing the power generation from decreasing. However, in any case, it is required for the information (that is, the display pattern) to be indicated at such a magnitude that can be visualized. Therefore, there is a disadvantage such that it is difficult to store information at a high density, and therefore, the quantity of information which can be indicated is small.

The foregoing situations in the conventional solar cell modules in that the power generation is decreased in the case of increasing the quantity of information to be indicated and a large quantity of information is difficult to be indicated are also similar in the case of the conventional strings.

SUMMARY OF THE INVENTION

A principal object of the present invention is to eliminate the foregoing problems in the prior art and provide a solar cell module, a solar cell module string and a solar cell system which can be readily supervised, wherein the maintenance and the like of them can be efficiently performed while readily obtaining their information with respect to administrative number, type, connector form, and the like without referring to a database or the like.

Another object of the present invention is to provide a solar cell module having a non-volatile readable and writable memory medium capable of writing in a large quantity of administrative information of the solar cell module and capable of readily selectively reading necessary information from said memory medium, and which can be readily and efficiently supervised.

A further object of the present invention is to provide a solar cell module string comprising a plurality of solar cell modules and having a non-volatile readable and writable memory medium capable of writing in a large quantity of administrative information of the solar cell module string and capable of readily selectively reading necessary information from said memory medium, and which can be readily and efficiently supervised.

A further object of the present invention is to provide a solar cell system having said solar cell module or said solar cell module string.

A further object of the present invention is to provide a method for supervising a solar cell module or a solar cell module string, comprising disposing a non-volatile readable and writable memory medium in said solar cell module or said solar cell module string, said memory medium being capable of storing a large quantity of information therein; and supervising said solar cell module or said solar cell module string by writing necessary administrative information in said memory medium or selectively reading necessary information from said memory medium.

BRIEF DESCRIPTION OF THE DRAWINGS

FIG. 1(a) is a schematic slant view illustrating an example of a solar cell module according to the present invention, when viewed from the light receiving face side.

FIG. 1(b) is a schematic view of the solar cell module shown in FIG. 1(a), when viewed from the rear face side.

FIG. 3 is a schematic cross-sectional view illustrating an example of the constitution of a solar cell module according to the present invention.

FIGS. 4(a) to 4(e) are schematic views showing an embodiment of writing information in a readable and writable memory medium provided in a solar cell module and reading necessary information from said memory medium in a method of supervising a solar cell module in the present invention. FIG. 4(a) shows a state of writing an inherent identification number and other data of a solar cell module in a readable and writable memory medium, FIG. 4(b) shows a state of writing inspected results of the solar cell module in the memory medium. FIG. 4(c) shows a state of writing an inherent identification number of a package for the solar cell module in the memory medium. FIG. 4(d) shows a state of writing the situation of the solar cell module when it is installed on a roof. FIG. 4(e) shows a state of writing history information of the installed solar cell module in the memory medium and a state of writing the situation of the solar cell module when it is dismantled.

FIG. 7 is a schematic diagram illustrating an electric system used in the case of practicing a supervising method of a solar cell module string in the present invention, in which electrical connection bearings among solar cell modules installed on a roof, a connection box and an inverter are shown.

FIG. 15 is a schematic view illustrating an example of a non-volatile readable and writable means used in the solar cell module shown in FIGS. 14(a) and 14(b), in which a circuit having said memory means is shown.

FIG. 16 is a schematic view illustrating an installation state for a plurality of solar cell modules arranged on a roof of a building and electrically connected with each other.

DETAILED DESCRIPTION OF THE INVENTION AND PREFERRED EMBODIMENTS

Figure 2A:
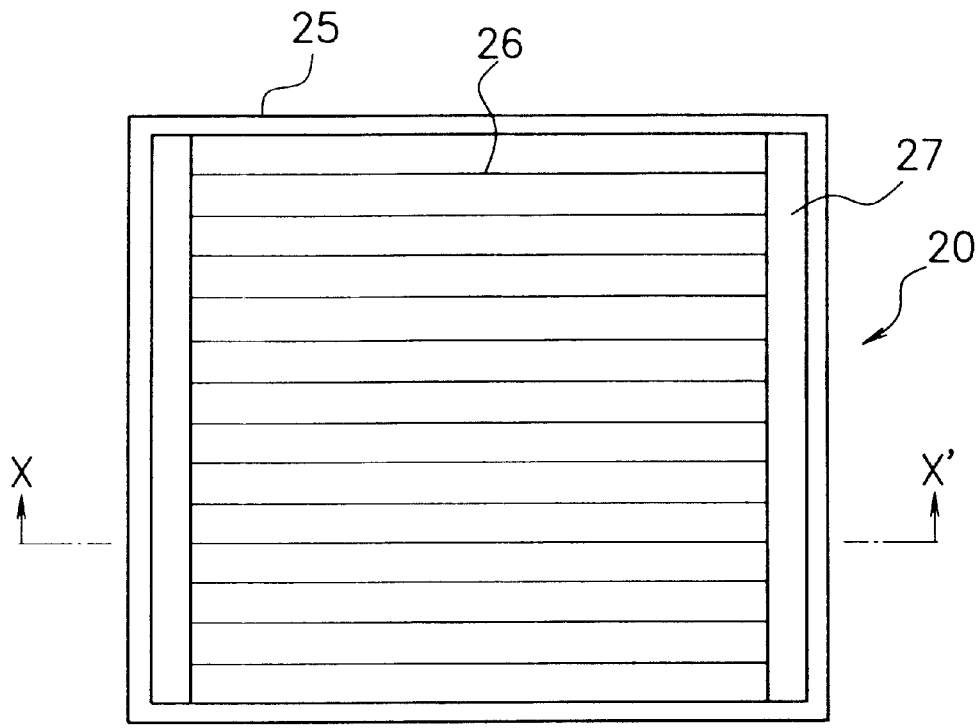
FIG. 2(a) is a schematic view illustrating an example of an amorphous type photovoltaic element (or an amorphous silicon solar cell) used in a solar cell module according to the present invention, when viewed from the light receiving face side of said photovoltaic element (solar cell).

The present invention eliminates the foregoing problems found in the prior art and attains the above described objects.

The present invention provides a solar cell module having a non-volatile readable and writable memory medium capable of writing in a large quantity of administrative information of the solar cell module and capable of readily selectively reading necessary information from said memory medium, and which can be readily and efficiently supervised.

The present invention also provides a solar cell module string comprising a plurality of solar cell modules and having a non-volatile readable and writable memory medium capable of writing in a large quantity of administrative information of the solar cell module string and capable of readily selectively reading necessary information from said memory medium, and which can be readily and efficiently supervised.

The present invention further provides a solar cell system having said solar cell module or said solar cell module string.

The present invention still further provides a method for supervising a solar cell module or a solar cell string, comprising disposing a non-volatile readable and writable memory medium in said solar cell module or said solar cell module string, said memory medium being capable of storing a large quantity of information therein; and supervising said solar cell module or said solar cell module string by writing necessary administrative information in said memory medium or selectively reading necessary information from said memory medium.

A principal feature of the present invention lies in a specific non-volatile readable and writable memory medium in a solar cell module. The readable and writable memory medium in the present invention is capable of writing and storing electronized or magnetized information therein and capable of selectively reading desired information therefrom. The readable and writable memory medium is clearly distinguished from the foregoing conventional information-indicating medium such as the face plate which indicates a encoded information such as a character retained therein.

In the following, the present invention will be detailed with reference to the drawings.

FIG. 1(a) is a schematic slant view illustrating an example of a solar cell module according to the present invention, when viewed from the light receiving face side.

FIG. 1(b) is a schematic view of the solar cell module shown in FIG. 1(a), when viewed from the rear face side.

In FIGS. 1(a) and 1(b), reference numeral 100 indicates the entirety of a solar cell module. The solar cell module 100 comprises a plurality of solar cells 101 spacedly arranged on a flat front face of a reinforcing member 102 (a retaining member) whose opposite long edge side end portions are bent upward on the light receiving face side, where the solar cells 101 are electrically connected with each other in series connection or parallel connection to establish a solar cell string or array (this will be hereinafter referred to as "solar cell string" for simplification purposes). The solar cell string is sealed by a surface covering material (not shown) and a back face covering material (not shown). Each of the solar cells 101 comprises a photovoltaic element group (not shown) comprising a plurality of photovoltaic elements (not shown) electrically connected with each other. The region having the solar cell string in the solar cell module will be hereinafter occasionally referred to as the "power generation region".

Reference numeral 103 indicates a non-volatile readable and writable memory medium which is arranged on the rear face of the reinforcing member 102 having the power generation region on its front face in order to prevent the memory medium from being directly irradiated with light.

On the rear face of the reinforcing member 102, there is also arranged a power outputting means comprising a terminal box 104 provided with a pair of power output cables 105 each having a connector 106 (e.g., a one-touch system connector). A pair of power output terminals extending from the solar cell string are drawn through a hole (not shown) formed at a solar cell-free end portion of the reinforcing member 102 in the longitudinal direction and connected to the terminal box 104. The cables 105 are electrically connected to the power output terminals from the solar cell string in the terminal box 104. The solar cell module 100 may be electrically connected to other solar cell modules through the connectors 106. Alternatively, it is possible that the solar cell module 100 is connected to a junction box (not shown) through the connectors 106 so as to output an electric power generated by the solar cell module to the outside.

Description will be made in more detail of the non-volatile readable and writable memory medium 103 used in the present invention.

The non-volatile readable and writable memory medium 103 is such that information once stored in the memory medium is maintained without being erased unless an indication of erasing is given. The memory medium 103 is capable of memorizing information in a state which cannot be visualized. The memory medium 103 typically comprises a semiconductor non-volatile memory (not shown) which will be described later.

The information stored in the non-volatile memory medium 103 includes information of a given solar cell module (that is, the solar cell module 100) prior to installing it on a roof of a building or the like. Specific examples of such information are the type, rating, administrative number and the like for the solar cell module or these items of the solar cells constituting the solar cell module; inherent particulars of the solar cell module such as the production date, production place, production condition and destination; respective articles used and their types; and the electric performances of the solar cells constituting the solar cell module. Besides, the previously described information which is described in the foregoing face plate and which is recorded in the foregoing administrative register or database (the computer or the like) can be also stored in the memory medium 103.

This information is written in the memory medium 103 by means of a writing means (not shown) prior to installing the solar cell module 100 on an installation place such as a roof of a building or the like. After the solar cell module is installed on the installation place, a large quantity of necessary information can be selectively read by means of a reading means (not shown).

In this way, for the solar cell module 100 provided with the non-volatile readable and writable memory medium 103, a large quantity of information including that information described in the foregoing face plate and recorded in the foregoing administrative register or database (the computer or the like) can be stored together and retained in the memory medium 103 which occupies a small area of the back face of the reinforcing member having the solar cell string on the front face thereof. A large quantity of necessary information can be selectively read at the same time.

Further, because the non-volatile readable and writable memory medium 103 is arranged on the non-light receiving face (the rear face) of the solar cell module 100, the light receiving face (having the power generation region) of the solar cell module sufficiently receives incident light without decreasing the quantity of light impinged in the power generation region of the solar cell module due to such identifying indication means as in the prior art which are disposed in the light receiving face of the conventional solar cell module. Thus, the solar cell module 100 is completely free of a prior art problem of decreasing the power generation.

As above described, the non-volatile readable and writable memory medium 103 is arranged on the non-light receiving face (the rear face) of the solar cell module 100. In the case where the solar cell module is installed, for instance, on a roof of a building and it is continuously exposed to irradiation of sunlight in order to perform power generation, the temperature of the light receiving face of the solar cell module is extremely high due to continuous irradiation of sunlight. In this case, where an article whose heat-resisting temperature such as a semiconductor non-volatile memory is arranged on the light receiving face of the solar cell module, it is eventually deteriorated due to such high temperature. In this connection, by arranging the non-volatile readable and writable memory medium 103 on the non-light receiving face which is maintained at a relatively low temperature when sunlight is continuously irradiated to the light receiving face, the reliability of the memory medium is maintained without being deteriorated.

The non-volatile readable and writable memory medium 103 may comprise, other than the above described semiconductor non-volatile memory, an optical memory medium, a memory medium comprising a magnetic body, a non-volatile memory medium other than the semiconductor non-volatile memory, or an IC card. In the case where the solar cell module is installed on a roof of a building, it is continuously used over a long period of time, for instance, some tens of years. In this connection, it is necessary to selectively use an optimum one of these memory mediums as the memory medium 103 with consideration of the durability including weatherability and the like. In this case, it is also necessary to have due care about the lifetime, resistance to environment (heat, vibration and the like), design and the like.

The above memory medium comprising the magnetic body means a magnetism-bearing memory medium having a magnetic body which performs writing and reading of information by means of a writing and reading means comprising a magnetic head. In this case, the magnetic body is oriented by virtue of the magnetic head, whereby necessary information can be written in the memory medium or it can be read out from the memory medium. Arrangement of the magnetism-bearing memory medium on the solar cell module may be conducted by (a) directly depositing an appropriate magnetic body on a constituent member (that is, the reinforcing member) of the solar cell module, (b) fixing an appropriate magnetic body onto the constituent member using an adhesive resin, or (c) providing a memory medium comprising a magnetic body disposed on a substrate comprising, for instance, a magnetic tape and laminating the memory medium on the constituent member though the substrate using an adhesive resin.

In the case of using the magnetic tape having a magnetic body as the memory medium, because the magnetic tape is of a thin thickness, the magnetic tape may be arranged on a solar cell-free portion of the light receiving face of the solar cell module, where it is necessary to have due care about the heat resistance and weatherability. In this case, because the magnetic tape is thin, the memory medium comprising the magnetic tape is inconspicuous in terms of the external appearance, and a large quantity of information can be also stored in the memory medium. In this case, the memory medium comprising the magnetic tape is desired to be arranged at a position of the light receiving face of the solar cell module which does not obstruct incident light from being impinged in the power generation region.

Besides the foregoing manners (a) to (c), it is possible to adopt a manner of printing a toner or ink containing a magnetic body on an appropriate position of the non-light receiving face of the solar cell module. Specifically, the toner comprises the magnetic body and a binder resin, and if necessary, a pigment or dye which is added as required. The ink comprises the magnetic body, a binder resin and a solvent, and if necessary, a pigment or dye which is added as required.

As the magnetic body, there can be mentioned, for example, metals such as Fe, Co, and the like; alloys of these metals; metal oxides such as iron oxides and the like; ferrites such as Mn-Zn ferrite, Ni-Zn ferrite, and the like. Besides, magnetite, hematite and the like are also usable.

In order to improve the dispersion of the magnetic body in the resin, it is possible that the surface of the magnetic body is treated by a silane coupling agent or a titanium series coupling agent.

As the resin to which the magnetic body is added and the binder resin used in the toner and ink, there can be mentioned, for example, polyester resin, styrene resin, styrene-acrylonitrile resin, polymethylmethacrylate resin, polyvinyl acetate resin, epoxy resin, and the like. These resins may be used alone or in combination of two or more of them.

In order to prevent the arranged memory medium from being deteriorated with time such that it is colored due to light, heat or moisture, it is desired for the base member or the binder resin of the memory medium to be mixed with a UV absorber, an antioxidant, or the like.

The base member of the memory medium is desired to comprise a film made of an organic polymer which excels in weatherability and heat resistance. The organic polymer can include, for example, polyethylene terephthalate, polyethylene naphthalate, polyimide, polyetherimide, and the like.

As the foregoing ink, solvent series inks are the most appropriate because they can be quickly dried. Preferable examples of the solvent of the ink are acetone, toluene, xylene, isopropyl alcohol, carbitol, ethyl acetate, methyl ethyl ketone, and the like.

Specific examples of the foregoing semiconductor non-volatile memory are ROMs such as so-called PROM, e.g., OTPROM, EPROM, and EEPROM, flash memories, and RAMs such as DRAM and SRAM.

The PROM is a semiconductor non-volatile memory which can be desirably used only in the case of reading out already stored information.

The flash memory is a semiconductor non-volatile memory which can be desirably used not only in the case of reading out information but also in the case of frequently writing information. Particularly, this memory is capable of writing whenever the necessity of writing certain information is occurred.

The RAM such as DRAM or SRAM is generally used as a semiconductor volatile memory, but it can be used as the semiconductor non-volatile memory by using a power source to supply an electric power thereto.

In the case where the non-volatile readable and writable memory medium 103 comprises a flash memory or the like, it is not always necessary to provide a power source. But in the case where the non-volatile readable and writable memory medium 103 comprises DRAM or SRAM, it is required to provide a power source in the solar cell module, particularly in the memory medium for the reason described in the above. Providing the power source in this way is also necessary for communicating with the outside. The power source in this case may comprise, for instance, a coil power source utilizing a magnetoelectric effect. Besides, it is possible that the solar cell module on which the non-volatile readable and writable memory medium is arranged is used as the power source. In this case, there is an advantage in that the power source can be established without using any new component.

In the case where the non-volatile readable and writable memory medium 103 comprises a combination of a semiconductor volatile memory such as DRAM or SRAM and a power source, it is necessary to be designed such that an electric power is supplied to the semiconductor volatile memory from the power source. As the power source in this case, it is desired to use a battery or a storage battery. The battery or storage battery in this case may be used also as a power source for driving a control circuit or a power input-output means. Using the battery or storage battery provides an advantage in that a stable electric power can be constantly supplied for a prescribed period of time.

In the above, description has been made of the case of using the magnetic body and the case of using the semiconductor non-volatile memory as the memory medium 103. But these are only for illustrative purposes and are not limitative. Besides, any other appropriate materials or components may be selectively used as long as they satisfy the related conditions including lifetime which are required for the memory medium 103.

The memory medium 103 may be constituted so that it can be optionally loaded on and unloaded from the solar cell module. This enables the writing and/or reading of information for the memory medium independently from the solar cell module main body.

Besides, the memory medium 103 may be designed so that related information of a given solar cell module can be memorized therein prior to installing the solar cell module on a given installation place. The related information of the solar cell module prior to its installation includes information of the solar cell module when produced, information of the solar cell module when packed in a package, and information of the solar cell module when shipped from a factory. This situation will be later described in more detail with reference to FIG. 4.

In the case where the battery (or the storage battery) is used as described in the above, the battery may be designed to have a charging function by making the solar cell module itself serve as a charging device for the battery. In this case, a stable electric power can be constantly supplied to the battery over a long period of time.

Separately, it is possible to provide a power converter for converting an electric power (a DC power) generated by the solar cell module into an AC power, which is followed by being outputted to the outside. As such power converter, it is possible to use a MIC (a module-integrated-converter). In this case, it is possible to arrange the foregoing non-volatile memory or the foregoing volatile memory, a power input-output means to electrically connect said memory to the outside or a control means to perform writing or reading for said memory, and a power input-output means to make said control means deliver and receive data with respect to the outside.

In the case of a solar cell module string comprising a plurality of solar cell modules, each having the foregoing non-volatile readable and writable memory medium and which are electrically connected with each other, it is possible that a given non-volatile readable and writable memory medium capable of totally memorizing and storing information of all the solar cell modules is used, and a control means to perform writing and reading for said memory medium and a power input-output means to make said control means deliver and receive data with respect to the outside are provided in each of the solar cell modules. In this case, the memory medium provided in each solar cell module is desired to be made such that it functions to memorize inherent information of the solar cell module involved.

Separately, in the case where the power input-output means is provided on the non-light receiving face side of the solar cell module 100, in order to perform information exchange with the outside through the power input-output means, when the power input-output means comprises a wire system, there is a manner that part of the wiring system of the solar cell module is dismantled to form electrical contact points with the power input-output means so as to make it possible to perform said information exchange with the outside. The information exchange with the outside can be performed without dismantling the wiring system of the solar cell module as above described, by using a wireless magnetic communication means or an electrostatic communication means instead of the foregoing power input-output means.

In addition to the power input-output means which is provided on the non-light receiving face side of the solar cell module, another power input-output means may be provided on the light receiving face side. In this case, for instance, in the case where a number of solar cell modules having such configuration as above described are arranged on a roof of a building and maintenance is required for one of these solar cell modules, the information stored in the memory medium of the solar cell module can be read from the outside without demolishing part of the roof. This is accomplished by using a communication means of communication through the power inputting and outputting provided in the light receiving face side, wherein it is also possible to write necessary information in the memory medium of a specific solar cell module from the outside. As the communication means, there can be mentioned an optical communication means, a magnetic communication means, an electrostatic communication means, and an electric communication means having electric contact points. It is desired to selectively use the most appropriate one of these communication means depending on the situation involved. Thus, in the case where the power input-output means is provided on the light receiving face side of the solar cell module, there is an advantage in that various communication means such as optical communication means, magnetic communication means, electrostatic communication means, and electric communication means having electric contact points can be selectively used without demolishing the system involved.

Now, as previously described with reference to FIGS. 1(*a*) and 1(*b*), the solar cell module 100 comprises a plurality of solar cells 101 spacedly arranged on the reinforcing member 102 while being electrically connected with each other in series connection or parallel connection. Each of the solar cells 101 comprises a photovoltaic element group (not shown) comprising a plurality of photovoltaic elements (not shown) electrically connected with each other, where the photovoltaic element group is sealed by a surface covering material (not shown) and a back face covering material (not shown).

In the following, description will be made of principal constituents of the photovoltaic element constituting the solar cell.

Photovoltaic Element

Each photovoltaic element constituting the solar cell 101 in the present invention may be an amorphous type photovoltaic element having a semiconductor photoactive layer composed of, for instance, an amorphous silicon (a-Si) material; a crystalline type photovoltaic element having a semiconductor photoactive layer composed of, for instance, a polycrystalline silicon material or a single crystalline silicon material; a compound semiconductor type photovoltaic element having a semiconductor photoactive layer composed of a compound semiconductor material; or a Schottky junction type photovoltaic element.

Description will be made of said amorphous type photovoltaic element and said crystalline type photovoltaic element while referring to the drawings.

It should be understood that these photovoltaic elements are only for illustrative purposes and the present invention is not limited to these photovoltaic elements.

Figure 2B:
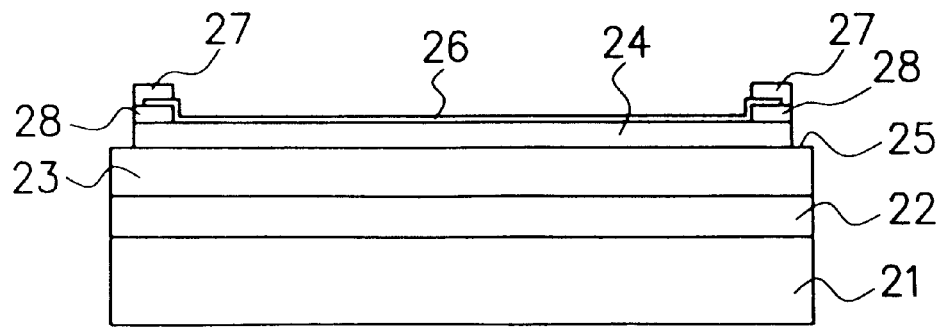
FIG. 2(b) is a schematic cross-sectional view, taken along the line X-X' in FIG. 2(a).

FIG. 2(a) is a schematic view illustrating an example of such amorphous type photovoltaic element, when viewed from the light receiving face side of the photovoltaic element. FIG. 2(b) is a schematic cross-sectional view, taken along the line X-X' in FIG. 2(a).

Figure 2C:
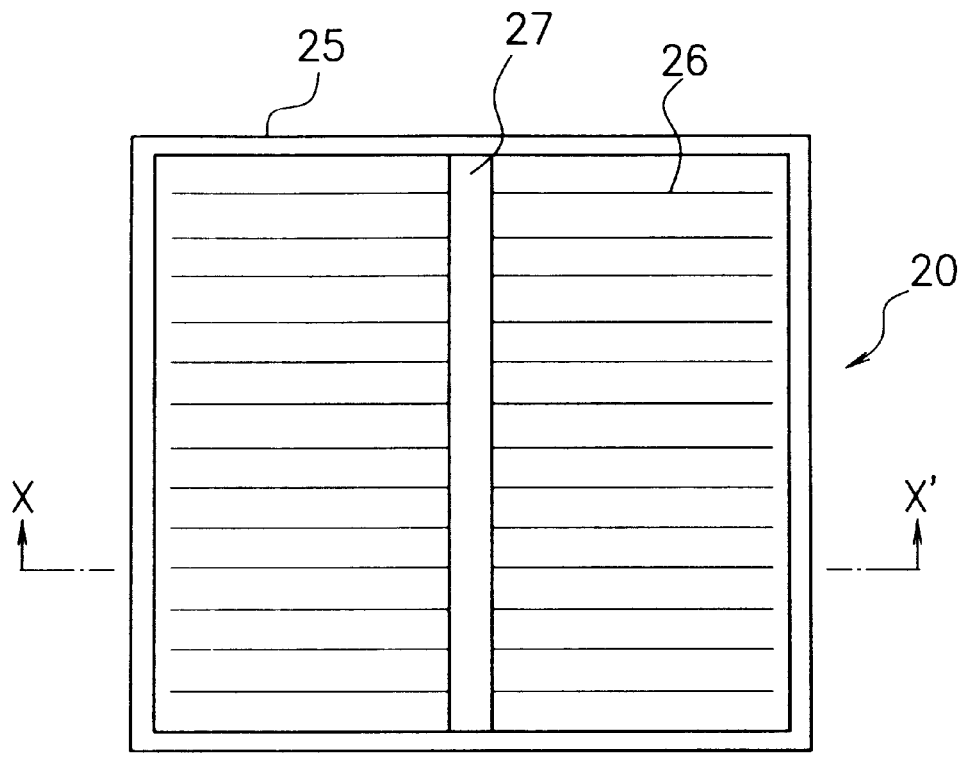
FIG. 2(c) is a schematic view illustrating an example of a crystalline type photovoltaic element (a crystalline series solar cell) used in a solar cell module according to the present invention, when viewed from the light receiving face side of said photovoltaic element (solar cell).
Figure 2D:
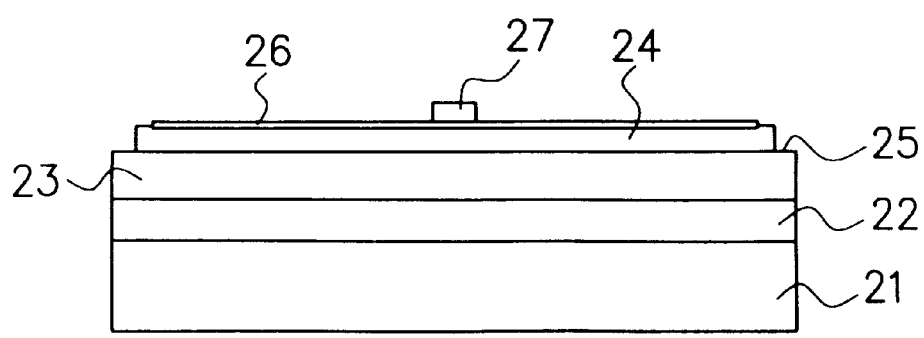
FIG. 2(d) is a schematic cross-sectional view, taken along the line X-X' in FIG. 2(c).

FIG. 2(c) is a schematic view illustrating an example of such crystalline type photovoltaic element, when viewed from the light receiving face side of the photovoltaic element. FIG. 2(d) is a schematic cross-sectional view, taken along the line X-X' in FIG. 2(c).

In FIGS. 2(a) to 2(d), reference numeral 20 indicates the entirety of a photovoltaic element. Reference numeral 21 indicates a substrate, reference numeral 22 a lower electrode layer, reference numeral 23 a semiconductor photoactive layer, reference numeral 24 an upper electrode layer (or an upper transparent electrode), reference numeral 25 an etched peripheral portion, reference numeral 26 a collecting electrode, reference numeral 27 a bus bar electrode, and reference numeral 28 an insulating adhesive tape.

In the following, description will be made of each constituent of the photovoltaic element 20 shown in FIGS. 2(a) to 2(d).

Substrate 21:

The substrate 21 serves as a substrate for the photovoltaic element. In the case of a single crystalline series photovoltaic element, the substrate is not always necessary.

The substrate 21 may be designed to serve also as a lower electrode. When the semiconductor photoactive layer 23 is formed at a high temperature, for instance, in the case of an amorphous silicon photovoltaic element, the substrate 21 is required to be constituted by a material having a heat resistance to endure such heating temperature.

The substrate 21 may comprise an electrically conductive member or an insulating member. The electrically conductive member can include, for example, metals such as Fe, Ni, Cr, Al, Mo, Au, Nb, Ta, V, Ti, Pt, Pb and the like; alloys of these metals such as brass, stainless steel and the like; and composites of these alloys. The insulating member can include, for example, films or sheets made of heat resistant synthetic resins such as polyester, polyethylene, polycarbonate, cellulose acetate, polypropylene, polyvinyl chloride, polyvinylidene chloride, polystyrene, polyamide, polyimide, and epoxy resin; composite members comprising one or more of these synthetic resins and glass fiber, carbon fiber, boron fiber or metallic fiber; and members made of glass or ceramics. When the substrate 21 comprises any of the above-mentioned electrically conductive members, it is possible to make the substrate function also as a lower electrode. In this case, the lower electrode layer 22 is required.

Lower electrode layer 22:

The lower electrode layer 22 is provided on the substrate 21 in the case where it is necessary. The lower electrode layer 22 functions as one of a pair of electrodes to output an electric power generated by the semiconductor photoactive layer 23. Thus, the lower electrode layer 22 is required to be capable of becoming an ohmic contact to the semiconductor layer and the like.

The lower electrode layer 22 may comprise a metal layer, a metal oxide layer, or a two-layered structure comprising a metal layer and a metal oxide layer.

The metal layer may be composed of a metal such as Al, Ag, Pt, Au, Ni, Ti, Mo, Fe, V, Cr, or Cu, or an alloy of these metals such as stainless steel, brass or nichrome. The metal oxide layer may comprise a transparent electrically conductive oxide (TCO) such as $SnO_2$, $In_2O_3$, $ZnO$, or ITO ($SnO_2+In_2O_3$).

The surface of the lower electrode layer 22 on which the semiconductor photoactive layer 23 is formed is desired to be flat. However, in the case where irregular reflection of light is intended to occur at the surface of the lower electrode layer, the surface may be processed into a textured surface.

Each of the metal layer and the metal oxide layer may be formed by a conventional technique such as plating, vacuum evaporation, or sputtering.

Semiconductor photoactive layer 23:

The semiconductor photoactive layer 23 performs photoelectric conversion. The semiconductor photoactive layer 23 may be composed of a conventional semiconductor material used in a conventional amorphous series photovoltaic element or a conventional crystalline series photovoltaic element. Specifically, the semiconductor photoactive layer 23 in the case of the amorphous series photovoltaic element may comprise, for instance, an amorphous silicon (a-Si) layer having a stacked structure with a pin junction. The semiconductor photoactive layer in the case of the crystalline series photovoltaic element may comprise, for instance, a polycrystalline silicon (poly-Si) layer having a stacked structure with a pn junction. Separately, the semiconductor photoactive layer in the case of the compound semiconductor series photovoltaic element may comprise, for instance, a layer having a stacked structure comprising $CuInSe_2$/CdS which has a pn junction.

Such a-Si layer having a stacked structure with a pin junction may be formed by a conventional chemical vapor phase growing technique such as plasma CVD, in which plasma discharge is caused in a film-forming raw material gas capable of imparting silicon atoms, such as silane gas. Such poly-Si layer having a stacked structure with a pn junction may be formed by a conventional polycrystalline silicon film-forming method of providing a fused silicon material and subjecting the fused silicon material to film-making processing or another conventional polycrystalline silicon film-forming method of subjecting an amorphous silicon material to heat treatment. Such compound semiconductor layer may be formed by conventional ion beam deposition, sputtering, or electrolytic technique in which a precipitate is formed by way of electrolysis of a desired electrolyte.

Upper electrode layer 24:

The upper electrode layer 24 formed on the semiconductor photoactive layer 23 serves as a counter electrode to the lower electrode comprising the lower electrode layer 22 which is situated under the semiconductor photoactive layer 23. The upper electrode layer 24 functions to take out an electromotive force generated by the semiconductor photoactive layer 23.

The upper electrode layer 24 is necessary in the case where the semiconductor photoactive layer 23 is constituted by an amorphous semiconductor material having a high sheet resistance such as an a-Si semiconductor material. In the case where the semiconductor photoactive layer 23 is constituted by a crystalline semiconductor material whose sheet resistance is low, the upper electrode layer 24 is not necessary to be provided.

The upper electrode layer 24 is positioned on the side where light is impinged, and because of this, the upper electrode is required to be transparent. In this respect, the upper electrode is occasionally denoted by the denomination "transparent electrode".

The upper electrode layer 24 is desired to have a light transmittance of more than 85% so that it allows the semiconductor photoactive layer 23 to efficiently absorb incident light. In addition to this, the upper electrode layer is desired to have a sheet resistance of $100\Omega/\square$ or less in the electrical viewpoint of making an electric current generated by light to flow in a lateral direction to the semiconductor photoactive layer 23.

The upper electrode layer 24 is composed of an appropriate material which satisfies the above conditions required for the upper electrode. Such material can include, for example, metal oxides such as $SnO_2$, $In_2O_3$, ZnO, CdO, $CdSnO_4$, and ITO ($In_2O_3+SnO_2$).

The upper electrode layer 24 comprising any of the above mentioned metal oxides may be formed by conventional resistance heating evaporation, sputtering, spraying, or CVD.

Etched peripheral portion 25:

The etched peripheral portion 25 denotes a portion formed by removing a predetermined peripheral portion of the upper electrode layer 24 by way of etching. The etched peripheral portion 25 is provided for the following reason. That is, the production of a photovoltaic element is generally conducted in a manner of producing a large area photovoltaic element comprising a lower electrode, a semiconductor photoactive layer and an upper electrode layer formed in this order on a long substrate, and cutting said large area photovoltaic element through its predetermined portions to obtain a plurality of photovoltaic elements having an equal size. For each of the photovoltaic elements thus obtained, there is a fear that the cut periphery thereof has a which occurs upon cutting and which will short-circuit between the lower electrode and the upper electrode. In order to prevent this, the etched peripheral portion 25 is provided at each photovoltaic element.

In order to remove a predetermined peripheral portion of the upper electrode layer 24 by way of etching to form an etched peripheral portion 25, an etching paste containing $FeCl_3$ or $AlCl_3$ can be applied onto a predetermined peripheral portion of the upper electrode layer 24 by means of screen printing or the like and the resultant can be subjected to heating treatment thereby removing said predetermined peripheral portion; a predetermined peripheral portion of the upper electrode layer 24 can be subjected to electrolytic treatment in an electrolyte solution thereby removing said predetermined peripheral portion; a predetermined peripheral portion of the upper electrode layer 24 can be removed by way of thermocompression treatment using a thermocompression jig; and a predetermined peripheral portion of the upper electrode layer 24 can be irradiated with laser beams to remove said predetermined peripheral portion.

Collecting electrode 26:

The collecting electrode 26 is arranged on the surface of the upper electrode layer 24. The collecting electrode 26 functions to efficiently output an electric power generated by the semiconductor photoactive layer 23 through the upper electrode layer 24. The collecting electrode 26 is desirably constituted by an electrically conductive material having a low resistivity in the interest of diminishing power loss. In addition, the collecting electrode 26 is desirably arranged in a comb-like form or a lattice-like form in order to diminish so-called shadow loss occupied by the collecting electrode in the light receiving area (the power generation area) of the photovoltaic element.

The collecting electrode 26 is constituted by an electrically conductive material which satisfies the above conditions. Particularly, the collecting electrode may be formed of an electrically conductive metal material of Al, Ag, Pt, Au, Ni, or Cu; an electrically conductive paste comprising powdered Al, Ag, Pt, Au, Ni, or Cu dispersed in a binder resin; an electrically conductive carbon paste; or a composite of these materials. The formation of the collecting electrode may be conducted, for example, by applying an electrically conductive paste comprising powder of a given metal material dispersed in a binder resin or an electrically conductive carbon paste by means of screen printing or the like, followed by subjecting to heat treatment or by coating the surface of a given metallic material (e.g., a metallic wire) by one of said pastes, followed by subjecting to thermocompression bonding treatment.

Bus bar electrode 27:

The bus bar electrode 27 is electrically connected with the collecting electrode 26. The bus bar electrode corresponds to an additional collecting electrode of the collecting electrode 26.

The bus bar electrode 27 functions to output the electric power generated by the semiconductor photoactive layer 23 to the outside of the photovoltaic element. The insulating adhesive tape 28 interposed between the upper electrode layer 24 and the bus bar electrode 27 [see, FIG. 2(b)] functions to electrically insulate between the bus bar electrode 27 and the upper electrode layer 24. Although not expressly being shown in the figures, if necessary, the bus bar electrode 27 is electrically isolated also from the semiconductor photoactive layer 23 or/and the lower electrode layer 22 or/and the substrate 21 using such insulating tape.

The bus bar electrode 27 may comprise a metallic member constituted by an electrically conductive metal material of Al, Ag, Pt, Au, Ni, or Cu which has a low resistivity.

The electrical connection between the bus bar electrode 27 and the collecting electrode 26 may be conducted by means of an electrically conductive paste, soldering, or brazing and soldering.

Now, description will be made of a solar cell module used in the present invention.

FIG. 3 is a schematic cross-sectional view illustrating the configuration of an example of a solar cell module used in the present invention.

In FIG. 3, reference numeral 30 indicates a solar cell which comprises a photovoltaic element group comprising a plurality of photovoltaic elements having such configuration as above described which are electrically connected with each other. Reference numeral 31 indicates a surface side filler, reference numeral 32 a surface protective member, reference numeral 33 a back face insulating member, reference numeral 34 a back side filler, reference numeral 35 a back face reinforcing member, and reference numeral 36 a surface side protective and reinforcing member.

Reference numeral 37 indicates a terminal box which is provided at the back face reinforcing member 35. The terminal box 37 is provided with a pair of power output cables 38 each having a connector 39.

In the following, description will be made of each constituent of the solar cell module shown in FIG. 3.

Surface side filler 31:

The surface side filler 31 comprises a transparent resin. The surface side filler 31 is necessary in order to cover irregularities present at the light receiving faces of the photovoltaic elements constituting the solar cell 30. The surface side filler prevents the photovoltaic elements from being influenced by external factors such as temperature changes and/or humidity changes in the external environment, externally applied impacts, and the like and allows a sufficient quantity of light to pass through to reach the photovoltaic elements. It also ensures adhesion between the solar cell 30 and the surface protective member 32. Hence, the surface side filler 31 is required to excel in transparency, weatherability, adhesion, packing property, heat resistance, cold resistance, and impact resistance. In order to satisfy these requirements, the transparent resin as the surface side filler 31 is desirably comprises a transparent thermoplastic resin. Such thermoplastic resins include polyolefinic resins such as EVA (ethylene-vinyl acetate copolymer), EMA (ethylene-methyl acrylate copolymer), EEA (ethylene-ethyl acrylate copolymer), and butyral resins; urethane resins; and silicone resins. Of these, EVA is particularly preferable because it exhibits well-balanced properties when used in a solar cell module.

With respect to EVA, as the deformation temperature thereof is low, EVA readily deforms or creeps when it is used under high temperature conditions. Therefore, in the case of using EVA, it is usually crosslinked by an organic peroxide as a crosslinking agent.

In addition, the transparent resin as the surface side filler 31 may contain an appropriate UV absorber in order to improve the weatherability. Further, if necessary, the transparent resin as the surface side filler 31 may also contain an appropriate photostabilizer.

Surface protective member 32:

The surface protective member 32 is situated at the outermost surface of the solar cell module, and therefore, it is required to be excellent in weatherability, pollution resistance and physical strength. In addition, in the case where the solar cell module is used under severe outdoor environmental conditions, the surface protective member is required to be such that it ensures the durability of the solar cell module upon repeated use over a long period of time. In view of this, as the surface protective member 32, there is used an appropriate transparent film composed of fluororesin or acrylic resin which satisfies the above requirements. Of these resins, fluororesin is the most appropriate because it excels in weatherability and pollution resistance. Specific preferable examples of the fluororesin are polyvinylidene fluoride resin, polyvinyl fluoride, and ethylene tetrafluoride-ethylene copolymer. Besides, it is possible to use a glass plate as the surface protective member 32.

Back face insulating member 33:

The back face insulating member 33 is used for the purpose of electrically isolating the photovoltaic elements constituting the solar cell 30 from the outside.

The back face insulating member 33 is desirably composed of a material capable of sufficiently electrically isolating the photovoltaic elements constituting the solar cell as above described and which excels in durability and flexibility, and withstands thermal expansion and thermal contraction. Specific examples of such material are nylon, polyethylene terephthalate, polycarbonate, and the like.

Back side filler 34:

The back side filler 34 ensures the adhesion between the solar cell and the back face insulating member 33. The back side filler 34 desirably comprises a resin material capable of ensuring sufficient adhesion, not only with the substrates of the photovoltaic elements constituting the solar cell 30 but also with the back face insulating member 33 and which excels in durability and flexibility, and withstands thermal expansion and thermal contraction.

Specific examples of such resin material are thermoplastic resins such as EVA (ethylene-vinyl acetate copolymer), EMA (ethylene-methyl acrylate copolymer), EEA (ethylene-ethyl acrylate copolymer), polyethylene, polyvinyl butyral, and the like. Besides, double-coated tapes and epoxy adhesives having flexibility are also usable.

Back face reinforcing member 35

The back face reinforcing member 35 is provided at the back face of the solar cell module in order to improve the mechanical strength of the solar cell module and in order to prevent the solar cell module from being distorted or warped due to changes in the environmental temperature, and also in order to make the solar cell module a roofing material integral type solar cell module.

The back face reinforcing member 35 may comprise a galvanized steel plate covered by an organic polymer resin excelling in weatherability and corrosion resistance, a plastic plate or a fiber glass reinforced plastic plate (or a so-called ERP plate).

Surface side protective and reinforcing member 36:

The surface side protective and reinforcing member 36 comprises an inorganic fibrous material which is impregnated in the transparent resin as the surface side filler 31.

The surface side protective and reinforcing member 36 is used mainly for the following reasons. That is, for a solar cell module, especially for a solar cell module which is installed on a roof or a wall of a building, it is required to be incombustible. On the other hand, when the amount of the surface side filler resin 31 used is large, the solar cell module becomes combustible; and when said amount is small, it becomes difficult to protect the photovoltaic elements in the solar cell module from external environments including externally applied impact. In this connection, in order to sufficiently protect the photovoltaic elements in the solar cell module from the external environments by a small amount of the surface side filler resin 31, the surface side filler resin 31 in which an appropriate inorganic fibrous material as the surface side protective and reinforcing member 36 is impregnated is used as the front side covering material in the solar cell module.

The inorganic fibrous material as the surface side protective and reinforcing member 36 can include, for example, nonwoven glass fiber members, woven glass fiber members, glass fillers, and the like. Of these, nonwoven glass fiber members are the most appropriate because they can be acquired at a reasonable cost, and they are readily impregnated in the transparent resin.

In the following, description will be made of a process of producing a solar cell module having such configuration as shown in FIG. 3.

The production of a solar cell module having such configuration as shown in FIG. 3 may be conducted by stacking respective lamination materials (34, 33, 30, 36, 31, and 32; see, FIG. 3) on a back face reinforcing member 35 to form a lamination stacked body and subjecting the lamination stacked body to vacuum lamination treatment.

Specifically, the solar cell module may be produced, for instance, in the following manner.

On a mounting plate of a laminator of single a vacuum system, a back face reinforcing member 35, a back side filler resin member 34, a back face insulating member 33 and an additional back side resin member 34 are stacked in this order. Then, a photovoltaic element group 30 (comprising a plurality of photovoltaic elements electrically connected with each other) is stacked on said additional back side resin member 34, so that its light receiving face side is faced downward, followed by stacking a surface side protective and reinforcing member 36, a transparent filler resin member 31, and a surface protective member 32 in this order. By this, there is formed a lamination stacked body on the mounting plate of the laminator. Then, a release sheet comprising, for instance, a fluororesin-coated fiber sheet (having a thickness of 0.2 mm) having a good releasing property and a silicone rubber sheet (having a thickness of 2 mm) are superposed over the stacked body so as to seal the stacked body between the mounting plate and the cover comprising the fluororesin-coated fiber sheet and the silicone rubber sheet to obtain an air bag system. The inside of the resultant air bag system containing the stacked body therein is evacuated at a desired inside vacuum degree, for instance, of 2.1 Torr for a desired period of time, for instance, 30 minutes by means of a vacuum pump. While continuing the evacuation of the inside of the air bag system by means of the vacuum pump, the air bag system is introduced into an oven whose inside atmosphere is maintained at a temperature of 160° C., where the stacked body in the air bag system is subjected to thermocompression bonding treatment for a predetermined period of time, for instance, 50 minutes. After this, the air bag system is taken out from the oven, and still under reduced pressure, the stacked body in the air bag system is cooled. Thereafter, the stacked body is taken out from the vacuum laminator. Thus, there is obtained a solar cell module.

A pair of power output terminals (not shown) extending from the photovoltaic element group are drawn through a terminal drawing hole formed at the back face reinforcing member 35 in advance, followed by introducing them into a terminal box 37 provided at the back face of the back face reinforcing member 35. The terminal box 37 is provided with a pair of power output cables 38 each having a connector 39. The power output terminals introduced into the terminal box 37 are electrically connected with the power output cables 38.

Now, description will be made of the previously described power input-output means for the non-volatile readable and writable memory medium. As previously described, the power input-output means is used for writing information in the non-volatile readable and writable memory medium comprising the semiconductor non-volatile memory or the like and reading necessary information from said non-volatile readable and writable memory medium. As the power input-output means, there can be employed a conventional wire power input-output means or a conventional wireless power input-output means. Specifically, as an example of such wire power input-output means, there can be mentioned a power input-output means having electrical contact points through which information is electrically inputted or outputted. As an example of the wireless power input-output means, there can be mentioned a means of inputting or outputting information by means of light, magnetism, or static electricity.

Separately, as previously described, in the case where the non-volatile readable and writable memory medium comprises a combination of a semiconductor volatile memory such as DRAM or SRAM and a power source, it is necessary that an electric power is supplied to the semiconductor volatile memory from the power source. As the power source in this case, it is desired to use a battery or a storage battery. As such battery, there can be used a conventional primary battery or a conventional secondary battery. Specific examples of such primary batteries are manganese dry batteries, silver series batteries, and alkaline manganese batteries. Specific examples of such secondary batteries are rechargeable lead batteries, rechargeable nickel-cadmium batteries, rechargeable nickel-metal hydride batteries, rechargeable lithium batteries, and rechargeable polymer batteries. As the power source to charge an electric power into such a rechargeable battery, it is possible to use the solar cell module having the non-volatile readable and writable memory medium provided therein. Besides, it is possible to use a coil power source utilizing a magnetoelectric effect. In the case where the non-volatile readable and writable memory medium is provided such that it is buried in a solar cell-free portion of the light receiving face of the solar cell module or in the back face sealing member of the solar cell module, it is desired to use a button-shaped battery or a coin-shaped battery.

Description will be made of a solar cell system in the present invention. There is no particular limitation for the specification thereof as long as a solar cell module is used. As a specific example of the solar cell system, there can be mentioned a system interconnection solar power generation system comprising a plurality of solar cell modules electrically connected with each other, a power conversion device for converting DC electric power into AC electric power, and a connection means to connect an electric power generated by the solar cell modules to the electric power system. This solar cell system is preferable since a maximum power output from the solar cell modules can be constantly attained.

Separately, for a solar cell module which comprises two or more solar cells each comprising a plurality of photovoltaic elements electrically connected with each other, there are known various configurations. For instance, it can be configured into a roofing material integral type solar cell module suitable for use in for lateral roofing, batten seam roofing, or flat roofing. It can be configured into an aluminum frame type comprising the solar cell module whose periphery is reinforced by an aluminum frame. It can be also configured into a flexible laminate type.

In the case of mass-producing such solar cell modules, in order to maximize the benefits of mass production, it usually requires that only several kinds of solar cell modules having a predetermined representative configuration are produced, and the resultant solar cell modules are selectively combined to establish a solar cell system having a desired configuration which can attain a desired power output. Specifically, for instance, in the case of forming a solar cell system capable of attaining a power output of 3 kW on a batten seam roof of a dwelling house, there can be mentioned a system constitution comprising 50 batten seam roofing material integral type solar cell modules, each capable of outputting an electric power of 60 W, a power conversion device for an electric power of 3 kW, and a connection means of connecting an electric power generated by the solar cell modules to the electric power system. The solar cell modules are electrically connected with each other in series connection or parallel connection so as to provide a desired voltage or electric current. DC electric power generated by the solar cell modules is converted into an AC electric power by means of an inverter provided in the above power conversion device. The desired voltage or electric current herein means a voltage value or an electric current value when the conversion efficiency of converting a DC electric power into an AC electric power becomes optimum. As another system constitution, there can be mentioned a solar cell system comprising an aluminum frame type solar cell module and a storage battery.

Besides these systems, the present invention is also applicable in a solar cell module provided with a power conversion means (e.g., a power converter). As such a solar cell module, there can be mentioned a module integrated converter (MIC) and a solar cell module provided with a power conversion means (e.g., a power converter) therein such as an AC module or the like. For these solar cell modules, it is necessary for the power converter (such as an inverter) used therein to be miniaturized and inexpensive. But these solar cell modules are advantageous in that they are capable of directly outputting an electric power suited for a load.

As previously described, the present invention includes a method for supervising a solar cell module or a solar cell module string comprising disposing a non-volatile readable and writable memory medium in said solar cell module or said solar cell module string, said memory medium being capable of storing a large quantity of information therein; and supervising said solar cell module or said solar cell module string by writing necessary administrative information in said memory medium or selectively reading necessary information from said memory medium. This method will be hereinafter referred to as "supervising method".

A typical embodiment of the supervising method is for a solar cell module. In particular, a non-volatile readable and writable memory medium is provided in said solar cell module, information of the solar cell at various stages after the production thereof and information of the solar cell after the installation thereof on a given place are written in the memory medium and necessary information is read out from the memory medium, whereby the solar cell module is supervised. Particularly, data (information) of the solar cell in various stages where the solar cell module is involved, e.g., practiced item, practiced date, measured value, and the like, are successively and additionally memorized in the memory medium. Thus, the data in all the stages of the processes which the solar cell module has undergone are memorized in the memory medium. And in the case of examining the history of the solar cell module, necessary information of the history is selectively read out from the data memorized in the memory medium.

Incidentally, as previously described, in the prior art, there is a disadvantage in that for a given solar cell module, when its history information is desired, it is necessary to undertake a complicated procedure of reaching a right administrative register or database corresponding to said administrative register and examining the administrative register or database to find the desired history information.

The supervising method of the present invention completely eliminates the disadvantage in the prior art, where without taking such complicated procedure, necessary information for a given solar cell module can be readily and instantly obtained.

In the following, an embodiment of the supervising method according to the present invention will be described with reference to FIGS. 4(a) to 4(e). FIGS. 4(a) to 4(e) are schematic views showing an embodiment of writing necessary information in a non-volatile readable and writable memory medium provided in a solar cell module and reading necessary information from said memory medium in the supervising method according to the present invention.

Description here will be made of a case wherein a plurality of solar cell modules, each having a prescribed non-volatile readable and writable memory medium provided on the back face [for instance, as shown in FIG. 1(b)] are installed on a given installation place.

First, in the memory medium of each solar cell module prior to the installation, an inherent identification number or designation of the solar cell module is written (memorized). This is schematically shown in FIG. 4(a). Particularly, as FIG. 4(a) illustrates, on the solar cell module 42 having the memory medium, a read-write head 48 for performing reading and writing of information is arranged. Here, in addition to said inherent identification number or designation of the solar cell module, the type, the production factory's name and the like are mainly written in the memory medium of the solar cell by means of the head 48 on the basis of a signal from a control system 49. The control system 49 contains a computer or sequencer programmed so that information of the solar cell module 42 to be memorized, i.e., the inherent identification number or designation of the solar cell module here, is controlled and can be issued on demand.

Then, when the solar cell module 42 is subjected to delivery inspection or end product inspection, the inspected result is written in the memory medium by a figure or a designation meaning acceptance or rejection or a rank. This is schematically shown in FIG. 4(b). Particularly, as FIG. 4(b) illustrates, the solar cell module 42 is subjected to measurement with respect to its characteristics by means of a module characteristic-measuring instrument 410. The measured result is converted into a figure or a designation meaning acceptance or rejection or a rank by means of the control mechanism 49, followed by writing it in the memory medium of the solar cell module by means of the head 48. The content measured by the measuring instrument 410 includes characteristic items of the solar cell module such as I-V characteristic, power output, voltage, electric resistance, and the like.

Thereafter, when the solar cell module 42 is packed into a packing box, the inherent identification number of the packing box, and the packing date or a designation or the like corresponding to the packing date are written in the memory medium of the solar cell module. This is schematically shown in FIG. 4(c). In FIG. 4(c), reference numeral 411 indicates a packaging box provided with an indicative means 412 on the side face, the indicative means 412 having, for instance, a bar code or the like corresponding to the foregoing information of the packaging box which can be read by a read-write head 413. Particularly, as FIG. 4(c) illustrates, the indicative means 412 (the bar code or the like) of the packaging box 411 is read by the read-write head 413. The content read by the head 413 is read by the read-write head 48, followed by being written in the memory medium of the solar cell module 42. After this, the solar cell module 42 is packed in the packaging box 411. Here, the memory medium of the solar cell module 42 contained in the packaging box 411 retains the inherent identification number and the like of the packaging box.

In this way, related data of the plurality of solar cell modules 42 provided are memorized in their memory mediums before they are installed on a given installation place. When these solar cell modules 42 are installed, in the memory medium of each solar cell module, destination and builder or designations corresponding to these, execution date, inspected result after the installation, and the like are written. This is schematically shown in FIG. 4(d). In FIG. 4(d), there is shown a roof 414 of a building on which the solar cell modules 42 are installed such that they are spacedly arranged at equal intervals. In the memory medium (not shown) of each of the solar cell modules 42, the above data (information) are written by means of, for instance, a portable type computer 415 using a read-write head 416.

Here, for explanatory purposes, FIG. 4(d) illustrates an embodiment which, after the solar cell modules 42 are installed on the roof 414, the foregoing data of each solar cell module are written in the memory medium. In order to simplify the operation, it is desired to take such a measure that shortly before the unpacked solar cell modules 42 are subjected to installation on the roof 414, the foregoing data are written in the memory medium of each of these solar cell modules.

When one of the solar cell modules 42 installed on the roof 414 is troubled and the troubled solar cell module is removed, the removal date is written in the memory medium. This is schematically shown in FIG. 4(e). Particularly, as FIG. 4(e) illustrates, in the memory medium of the troubled solar cell module 42 removed from the roof 414, the above information is written by means of, for instance, a portable type computer 415 using a head 416. Upon this operation, when the information memorized in the memory medium of the removed solar cell module 42 is read out, necessary information thereof such as the production place, the production date, the builder upon the installation, and the used period of time can be immediately learned.

When the troubled solar cell module is repaired, the repair shop or a designation corresponding thereto, the trouble reason, and the inspected result after the repair are written in the memory medium thereof. This operation can be performed in the same manner as shown in FIG. 4(d).

By memorizing the information at every stage as accomplished for the solar cell module 42 in the memory medium of the solar cell module, even when the solar cell module is repaired while being installed on the roof, the historical data thereof can be instantly found out simply by operating the reader of the memory medium. In this case, it is necessary to determine the arrangement of the memory medium or that of the interface portion between the memory medium and the reader so that the reader can be desirably operated for the solar cell module in an installed state.

The historical data (information) of the solar cell module 42 thus found out can be utilized for various purposes. For instance, beyond simply ascertaining the identification number of the solar cell module, the historical data can be used as a tool in order to specify, for instance, a cause of the trouble or the like. Besides, for instance, when it is designed such that the quantity of a power generated by the solar cell module can be periodically memorized in the memory medium using a means capable of examining the quantity of power generated which is separately provided, the deteriorated state of the solar cell module can be instantly learned. This way is effective also in finding out a cause when the solar cell module is troubled.

By investigating the data memorized in the memory medium of the solar cell module as above described, the history of the solar cell module can be instantly learned. In this way, the supervision of the solar cell module always can be readily performed. However, it is possible to use together an administrative register or a database or the like corresponding to said administrative register. In this case, since the information has been already electronized, use of the database is the most appropriate. Specifically, when the information is written in the database, it is not necessary to conduct work in an environment capable of having access to the database. Executed contents, executed dates and the like are typed in a data region corresponding to the inherent identification number of the solar cell module. For instance, the system can be programmed so that when a certain content memorized in the memory medium of the solar cell module is read out by means of a reader connected to the database on line, the content read out is directly written in the data region corresponding to the inherent identification number of the solar cell module.

It is desired to use the reader connected to the database on line as above described. However, after the solar cell module has been installed, when a certain additional information is newly obtained, it is generally difficult to input the additional information into the database on line. However in this case, it is possible to transmit the additional information into the database, for instance, through a floppy disk, MO disk or the like which is a supplementary means attached to the reader. Alternatively, it is possible to establish a data transmit-receive system by dismantling the memory medium from the solar cell module and connecting the memory medium to the database on line.

The supervision of a solar cell module string basically may be conducted in the same manner as in the foregoing method of supervising the solar cell module. In the case of supervising the solar cell module string, because the solar cell module string comprises a plurality of solar cell modules electrically connected with each other, inherent identification numbers and other related information of all the solar cell modules constituting the solar cell module string are to be memorized. Solar cell characteristics of all the solar cell modules constituting the solar cell module string are also to be memorized. In the case of the solar cell module string, it is possible to provide a non-volatile readable and writable memory medium according to the present invention in one of the constituent solar cell modules. Alternatively, when a plurality of solar cell module strings are used together and every solar cell module string is wired in a junction box (not shown), it is possible to provide a non-volatile readable and writable memory medium according to the present invention in the junction box or an inverter (not shown) connected to the junction box. In this case, it is not necessary to provide an I/O connector or the like as the power input-output means for every solar cell module. In any case, it is important that every solar cell string is provided with at least one non-volatile readable and writable memory medium according to the present invention.

In the following, the advantages of the present invention will be described in more detail by reference to the following examples, which are provided merely for illustrative purposes and are not intended to limit the scope of the present invention.

EXAMPLE 1

In this example, there was used a magnetic body as the non-volatile readable and writable memory medium.

Figure 5:
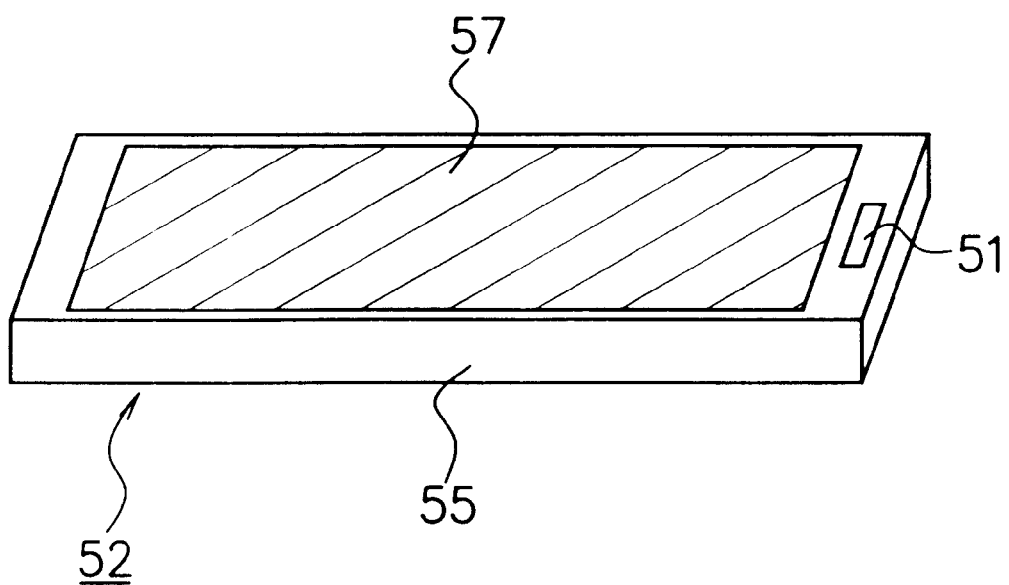
FIG. 5 is a schematic slant view illustrating another example of a solar cell module according to the present invention.

Particularly, there was provided a solar cell module having the configuration as shown in FIG. 5. In FIG. 5, reference numeral 52 indicates a solar cell module which comprises a framed structure 55 having a light receiving face provided with a power generation region 57 [comprising a plurality of solar cells electrically connected with each other which are sealed by a surface side covering material (not shown) and a back side covering material (not shown)].

A magnetic tape 51 having a length of 50 mm and a width of 10 mm was affixed to a predetermined solar cell-free portion outside the power generation region 57 on the light receiving face of the solar cell module 52 using an adhesive. The magnetic tape 51 herein has a dark gray appearance color similar to that of the frame of the solar cell module, in order to make the magnetic tape inconspicuous.

As the read-write head, there was used a modification of a conventional read-write head for a magnetic card.

Using this constitution, supervision of the solar cell module was practiced in accordance with the previously described procedures with reference to FIGS. 4(a) to 4(d).

Principal contents practiced in this example will be described since the procedures shown in FIGS. 4(a) to 4(d) have been previously detailed.

First, an inherent identification number "AM0001" of the solar cell module 52 was written in the magnetic tape 51 by means of the read-write head. Here, "A" is a mark corresponding to the name of the manufacturing factory where the solar cell module 52 was produced, and "M" is a mark which means the solar cell module 52.

Then, as a result of having inspected the solar cell module 52, the solar cell module was found to be a good product. In this respect, a designation "OK" was written in the magnetic tape 51 in the same manner as in the above.

Successively, the solar cell module 52 was packed in a packing box with an indication of "K0001". Thus, a designation "K0001" corresponding to the packing box containing the solar cell module therein was written in the magnetic tape 51 in the same manner as in the above.

Thereafter, the packing box was unpacked. And supposing the unpacked solar cell module 52 were installed on a certain place, a code "S" meaning execution work, "971201" meaning installed date, and "A" meaning an executor were together written in the magnetic tape 51 in the same manner as in the above.

After this, the contents memorized in the magnetic tape 51 were read out by means of the read-write head, followed by printing. As a result, the contents memorized in the magnetic tape 51 were printed out as follows:

AM0001

OK971105

K0001

S971201, A.

Thus, it was found that the foregoing information had been correctly memorized in the magnetic tape.

Based on the result, it is understood that for a given solar cell module to be inspected, when the solar cell module has an appropriate magnetic tape affixed thereon, it is possible to readily learn its historical information as recorded on with the magnetic tape.

EXAMPLE 2

The procedures of Example 1 were repeated, except that instead of the magnetic tape as the non-volatile readable and writable memory medium, a semiconductor non-volatile memory was provided in the solar cell module. Because a semiconductor non-volatile memory was used, a control circuit for the semiconductor non-volatile memory and an I/O connector as the power input-output means were also provided in the solar cell module. Particularly, taking into account resistance to environments, the semiconductor non-volatile memory and the control circuit were provided on the rear face (the non-light receiving face) of the solar cell module. And taking into account wiring after the installation of the solar cell module, the I/O connector was affixed to a predetermined solar cell-free portion outside the power generation region on the light receiving face of the solar cell module. The I/O connector herein has a dark gray appearance color similar to that of the frame of the solar cell module, in order to make the I/O connector inconspicuous.

Incidentally, the solar cell module herein has no power source function therein. Therefore, the control circuit in the solar cell module becomes operative when a connector of an external control portion is inserted in the I/O connector.

Using this constitution, supervision of the solar cell module was practiced in the same manner as in Example 1.

As a result, as well as in Example 1, it was confirmed that the information memorized in the non-volatile memory can be read out as expected.

EXAMPLE 3

In this example, as well as in Example 2, a semiconductor non-volatile memory and a control circuit for the semiconductor non-volatile memory were provided on the rear face (the non-light receiving face) of the solar cell module, and an I/O connector (having a dark gray appearance color similar to that of the frame of the solar cell module) was affixed to a predetermined solar cell-free portion outside the power generation region on the light receiving face of the solar cell module.

In addition, a small battery and a comparator were provided in the solar cell module. The small battery herein is used for operating the control circuit and the comparator. Hence, the memorization of information in the non-volatile memory can be performed without externally supplying an electric power through the I/O connector. The comparator herein is used for monitoring a voltage and an electric current which are generated in the solar cell module.

The solar cell module used in this example was found to be of optimum operation under conditions of 1 sun (AM 1.5) such that the optimum operating voltage (Vpm) is about 14 V and the optimum operating current (Ipm) is about 4.7 A. By the way, in general, the optimum operating points of a solar cell module vary depending upon the quantity of solar radiation, solar radiation spectrum, or the state of the solar cell module.

Figure 6:
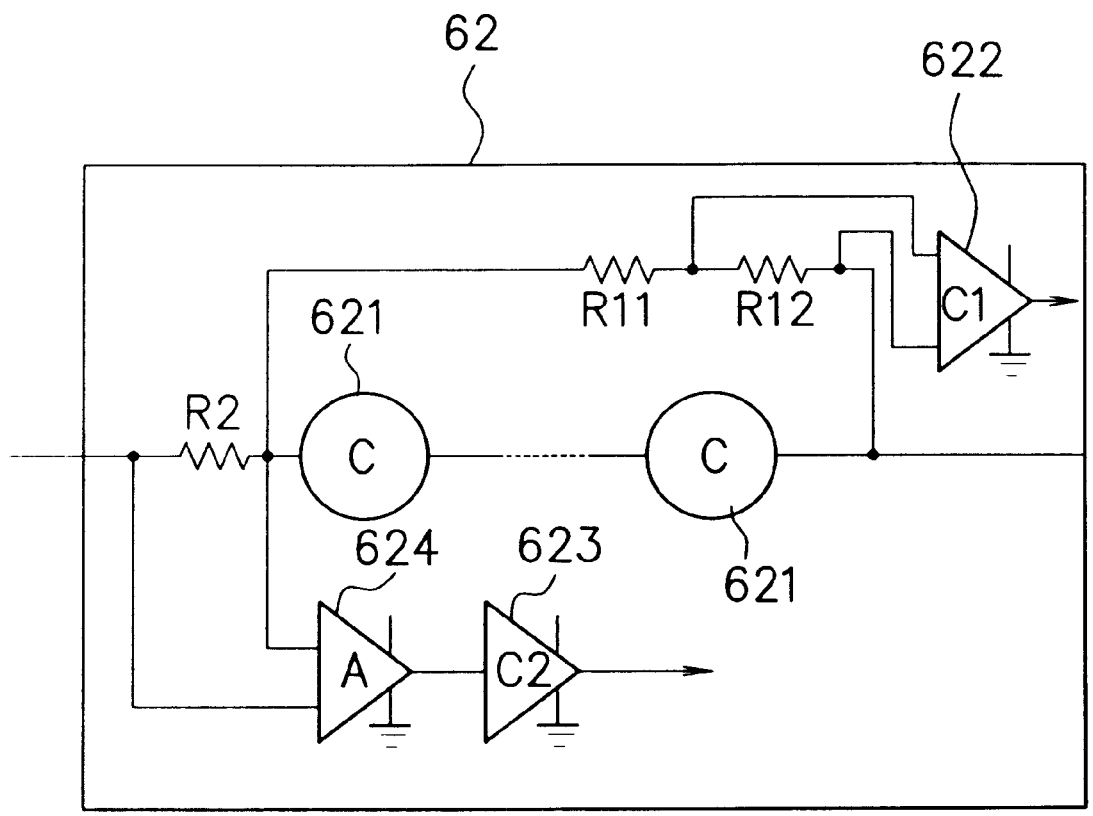
FIG. 6 is a schematic diagram illustrating an example of a control circuit for performing digital conversion of a generation state of a voltage and that of a power source in a solar cell module according to the present invention.

FIG. 6 is a schematic diagram illustrating an embodiment of the control circuit for the solar cell module in this example. In FIG. 6, reference numeral 62 indicates the solar cell module in this example. Reference numeral 621 indicates each solar cell in the solar cell module 62, and each of R11 and R12 indicates a resistor for performing resistance-division for a voltage, where $R11 \approx 900$ K$\Omega$, and $R12 \approx 100$ K$\Omega$. Each of reference numerals 622 and 623 indicates a comparator corresponding to the foregoing comparator. Reference numeral R2 indicates a monitoring micro resistor (0.01$\Omega$) provided in series connection in the circuit.

In the control circuit shown in FIG. 6, voltages generated at the opposite ends of the solar cell module 62 are subjected to resistance-division by means of the resistors R11 and R12, where the voltages are made to be 1/10, followed by being inputted into the comparator 622. That is, voltages generated at the opposite ends of the resistor R12 are converted into digital signals of ON/OFF by the comparator 622, and they are outputted from the comparator 622 into the control circuit (not shown) as the Vpm value. On the other hand, voltages generated at the opposite ends of the micro resistor R2 are amplified as large as 500 times by means of an amplifier 624, followed by being inputted into the comparator 623, where they are converted into digital signals, followed by being outputted from the comparator 623 into the control circuit (not shown) as the Ipm value.

The system was programmed so that given values on the basis of signals thus transmitted to the control circuit from the comparators 622 and 623 are memorized in the non-volatile memory at noontime every day. Here, the solar cell module 62 was made to always operate at the optimum operating points by an optimum operating points-tracking circuit (not shown).

After such preparation, the output signals from the comparators 622 and 623 were continuously memorized in the non-volatile memory of the solar cell module over 3 days. In this case, the comparator 622 was made to become ON at a module voltage of more than 13 V, and the comparator 623 was made to become ON at a module electric current of more than 4.5 A.

The information thus memorized in the non-volatile memory was read out. As a result, the following results were obtained.

|         | Comparator 622 | Comparator 623 |
|---------|----------------|----------------|
| 1st day | OFF            | OFF            |
| 2nd day | OFF            | OFF            |
| 3rd day | ON             | ON             |

Based on the results obtained, it is understood that the quantity of power generated was small in the first and second days, but in the third day, the quantity of solar radiation was large.

In the above, the solar radiation quantities are compared with the above results. This enables estimation of the occurrence of failure in the solar cell module. For instance, for a given day, although the quantity of solar radiation was large, both comparators 622 and 623 were OFF; hence, it is estimated that failure occurred in the solar cell module.

In this example, as above described, there was used a means of memorizing the voltage and electric current of the solar cell module in the non-volatile memory by separately digitizing each of them using an independent comparator, in order to facilitate easy memorization. When this idea is expanded so that the range of each of the voltage and electric current is divided so as to be capable of being recognized by a plurality of comparators, the operation points of respective solar cell modules can be memorized. In the case where the number of the comparators used is increased, the circuit can be simplified when a AD converter or the like is used instead of such increased number of comparators.

EXAMPLE 4

The procedures of Example 1 were repeated, except that an administrative database for the solar cell module was prepared, and it was designed so that information of the solar cell module can be written in the database using a floppy disk. As the memory medium, there was used a magnetic body (a magnetic tape) which is the same as that used in Example 1. The same procedures as in Example 1 were practiced, where the following information was written in the magnetic tape:

AM0001
OK971105
K0001
S971201, A.

Thereafter, the contents memorized in the magnetic tape were read out by means of the read-write head, followed by memorizing them in a floppy disk. Then, the contents memorized in the floppy disk were read by a terminal computer of the administrative database, whereby that information was added in the administrative database. As a result of having examined the database, it was found that the foregoing information was entirely stored in the database.

EXAMPLE 5

In this example, supervision was performed of a solar cell module string. Particularly, there were provided three solar cell module strings each comprising three solar cell modules electrically serialized with each other. The output terminals of each solar cell module string were wired in a junction box, all three solar cell module strings were electrically connected with each other in parallel connection in the junction box, and the output terminals from the junction box were wired in an inverter. In the junction box, a semiconductor non-volatile memory was provided. The electric current value of each solar cell module string was separately memorized in the non-volatile memory. For the voltage value, a common voltage value among the three solar cell module strings was memorized in the non-volatile memory. This is schematically shown in FIG. 7.

As shown in FIG. 7, there are arranged nine solar cell modules M11 to M33 on a roof 714 of a building. Particularly, these nine solar cell modules are arranged on the roof 714 while being classified into three groups, i.e., a first group comprising three solar cell modules M11 to M13, a second group comprising three solar cell modules M21 to M23, and a third group comprising three solar cell modules M31 to M33. The three solar cell modules in each of the three groups are serialized with each other by means of a cable 731 to establish a solar cell module string S1, a solar cell module string S2, and a solar cell module string S3. A pair of output cables are extended from each string, i.e., a pair of output cables C3 from the string S3, a pair of output cables C2 from the string S2, and a pair of output cables C1 from the string S1. These three pairs of power output cables C1 to C3 are wired in a junction box 732, where the three strings S1 to S3 are electrically connected with each other through their cables C1 to C3. In the junction box 732, for each of the three cable systems C1, C2 and C3, there was provided a connection circuit toward an inverter 733. For instance, in the case of the cable system C1, it is connected to cables C through switches S11 and S12 and a resistor K1. Similarly, the cable system C2 is connected to the cables C through switches S21 and S22 and a resistor K2, and the cable system C3 is connected to the cables C through switches S31 and S32 and a resistor K3. The cables C serve to collectively flow output powers from all the three strings S1 to S3. The cables C are wired to extend outside the junction box 732 and are electrically connected to the inverter 733. For instance, when the switches S11 and S12 are connected, the cable system C1 is connected to the cables C, where a power output from the string S1 is transmitted to the inverter 733. Each of the resistors K1 to K3 is a current detecting resistor of 0.01Ω. Description will be made of the resistor K1. Voltages generated at the opposite ends of the resistor K1 depending on an electric current flown in the cable system C1 are amplified as large as 50 times by an amplifier 734, followed by being transmitted into an A/D converter 735 (A/D). For information with respect to a digital-converted electric current by the A/D converter 735, it was made to pass through a control portion 736 and enter into a semiconductor non-volatile memory 737, where it was memorized.

Similarly, when the switches S21 and S22 or the switches S31 and S32 are connected, the cable system C2 or C3 is connected to the cables C, where a power output from the string S2 or S3 is transmitted to the inverter 733. And voltages generated at the opposite ends of the resistors K2 or K3 depending on an electric current flown in the cable system C2 or C3 are amplified as large as 50 times by an amplifier 738 or 739, followed by being transmitted into an A/D converter 735 (A/D). Also for information with respect to a digital-converted electric current by the A/D converter 735 in each case, it was made to pass through a control portion 736 and enter into a semiconductor non-volatile memory 737, where it was memorized.

In this way, the information with respect to electric current value for each string is memorized in the non-volatile memory 737. In addition, the voltages of the cables C are subjected to resistance division, followed by being inputted into the A/D converter 735.

In accordance with the above constitution, information relating to the electric current value of each string and also information relating to the voltage common among all the strings can be desirably memorized in the non-volatile memory 737. Here, the memorizing system was programmed so that the memorization of practical values is performed at noon time every day.

In the above constitution, supervision of the three solar cell module strings was practiced. And after operating the three solar cell module strings for three days, the information relating to the electric current values and voltage values of all the solar cell module strings memorized in the non-volatile memory were read out. As a result, it was found that all the solar cell module strings had been normally working as desired.

EXAMPLE 6

Figure 8A:
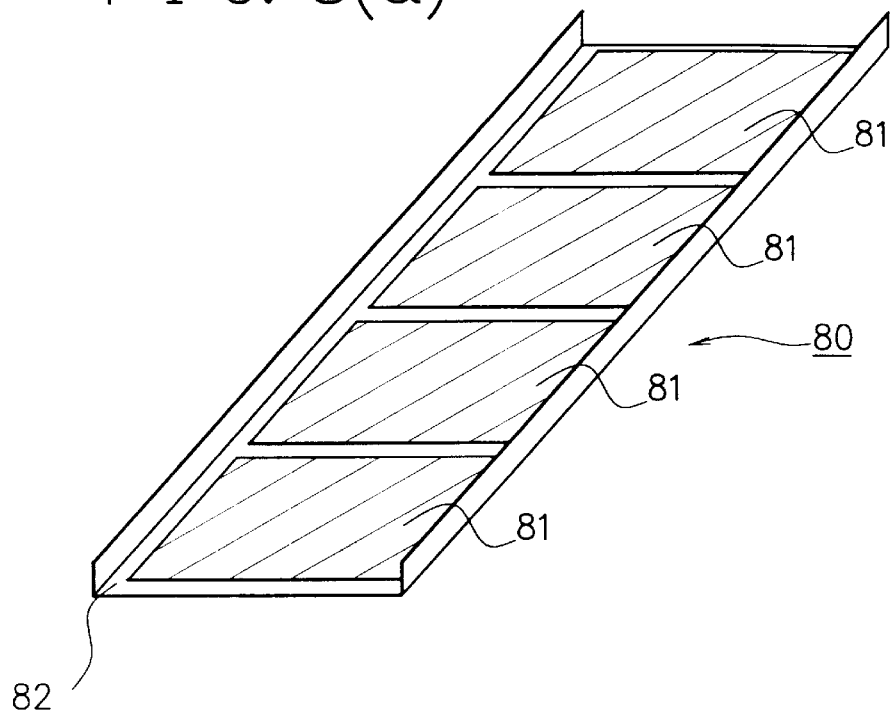
FIG. 8(a) is a schematic slant view illustrating a further example of a solar cell module according to the present invention, when viewed from the light receiving face side.
Figure 8B:
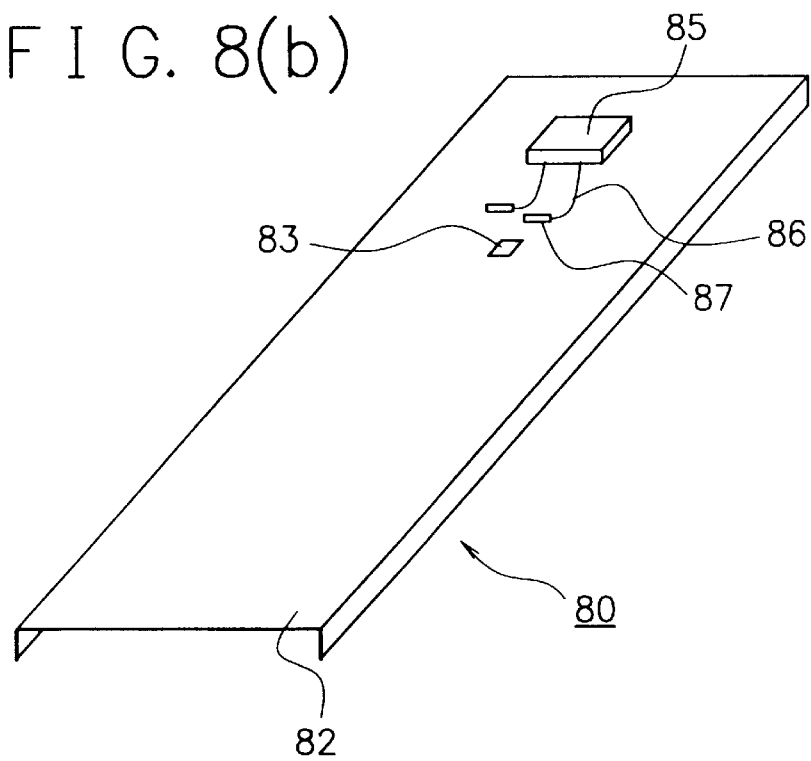
FIG. 8(b) is a schematic view of the solar cell module shown in FIG. 8(a), when viewed from the rear face side.

FIG. 8(a) is a schematic slant view illustrating an example of a solar cell module according to the present invention, when viewed from the light receiving face side. FIG. 8(b) is a schematic view of the solar cell module shown in FIG. 8(a), when viewed from the rear face side.

In FIGS. 8(a) and 8(b), reference numeral 80 indicates the entirety of a solar cell module. The solar cell module 80 comprises a plurality of solar cells 81 spacedly arranged on a flat front face of a reinforcing member 82 (a retaining member) whose opposite long edge side end portions are bent upward on the light receiving face side, where the solar cells 81 are electrically connected with each other and they are sealed by a surface covering material (not shown) and a back face covering material (not shown). Here, the front face of the reinforcing member 82 on which the solar cells 81 are arranged corresponds to a light receiving face of the solar cell module, and the region in which the electrically connected solar cells 81 are present on the front face of the reinforcing member 82 corresponds to a power generation region.

Each solar cell 81 comprises a photovoltaic element group comprising a plurality of photovoltaic elements electrically connected with each other.

Reference numeral 83 indicates a non-volatile readable and writable memory medium which is arranged on the rear face of the reinforcing member 82 having the power generation region on its front face in order to prevent the memory medium from being directly irradiated with light. The memory medium 83 herein may be designed so that it serves also as a so-called face plate used in the prior art.

On the rear face of the reinforcing member 82, there is also arranged a terminal box 85 provided with a pair of power output cables 86 each having a connector 87. A pair of power output terminals extending from the solar cells electrically connected with each other are drawn through a hole (not shown) formed at a solar cell-free end portion of the reinforcing member 82 in the longitudinal direction and connected to the terminal box 85. The cables 86 are electrically connected to said power output terminals in the terminal box 85.

Figure 9:
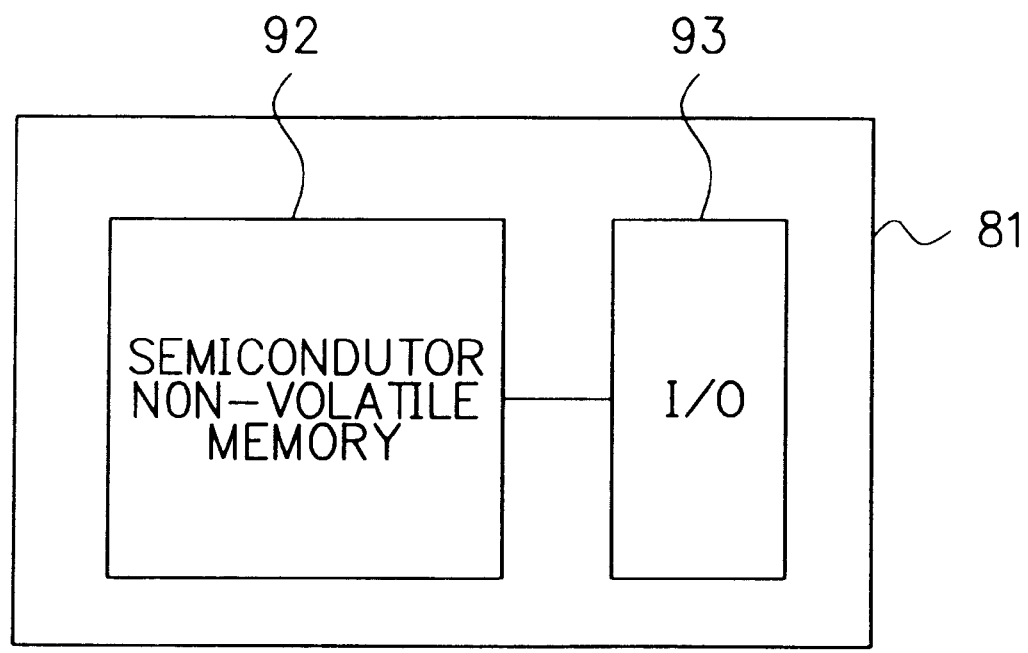
FIG. 9 is a schematic view illustrating an example of a non-volatile readable and writable memory means used in the solar cell module shown in FIGS. 8(a) and 8(b).

The non-volatile readable and writable memory medium 83 comprises a semiconductor non-volatile memory 92 and a power input-output means 93 as shown in FIG. 9. Specifically, as the semiconductor non-volatile memory 92, there was used a flash memory. And as the power input-output means 93, there was used a connector capable of performing electrical connection.

The non-volatile memory medium 83 is used for writing in the semiconductor non-volatile memory 92 information relating to, for example, electrical connection step of solar cells; lamination step of the solar cells; steps of fixing a terminal box and wiring for the terminal box; types of components used, administrative number, production date, manufacturer, production condition and the like in every production step; and the like.

In the case of establishing a solar cell system, there is adopted, for example, such a manner as will be described in the following. That is, a plurality of solar cell modules having such configuration as above described are provided, and they are arranged on a given installation place while being electrically connected with each other in series connection or parallel connection, whereby a solar cell system is established on said installation place. After the establishment of the solar cell system, for instance, in the case of performing maintenance for the solar cell system, even when data of their production are necessitated, it is not necessary to refer to a database on the basis of their administrative numbers. That is, from the semiconductor non-volatile memory 92, it is possible to readily obtain necessary information of the types of components used, administrative number, production date, manufacturer, production condition and the like in every production step which are all memorized in the semiconductor non-volatile memory through the power input-output means 93 and using a read-write head capable of reading information. Further, after the maintenance, the contents of the maintenance can be written in the semiconductor non-volatile memory 92 using said read-write head. By doing this, in the case of performing subsequent maintenance, it is possible to readily learn the results of the first maintenance.

As above described, the non-volatile readable and writable memory medium 83 which occupies a small space enables the memorization of a large quantity of information. Thus, a large quantity of information relating to the production of the solar cell modules and the results of maintenance can be memorized together in the non-volatile readable and writable memory medium. In addition, this information memorized in the non-volatile readable and writable memory medium can be readily read out. That is, various necessary information can be readily obtained from the non-volatile readable and writable memory medium 83 provided in the solar cell module. Thus, it is possible to promptly cope with any situation regarding the solar cell module.

EXAMPLE 7

Figure 10A:
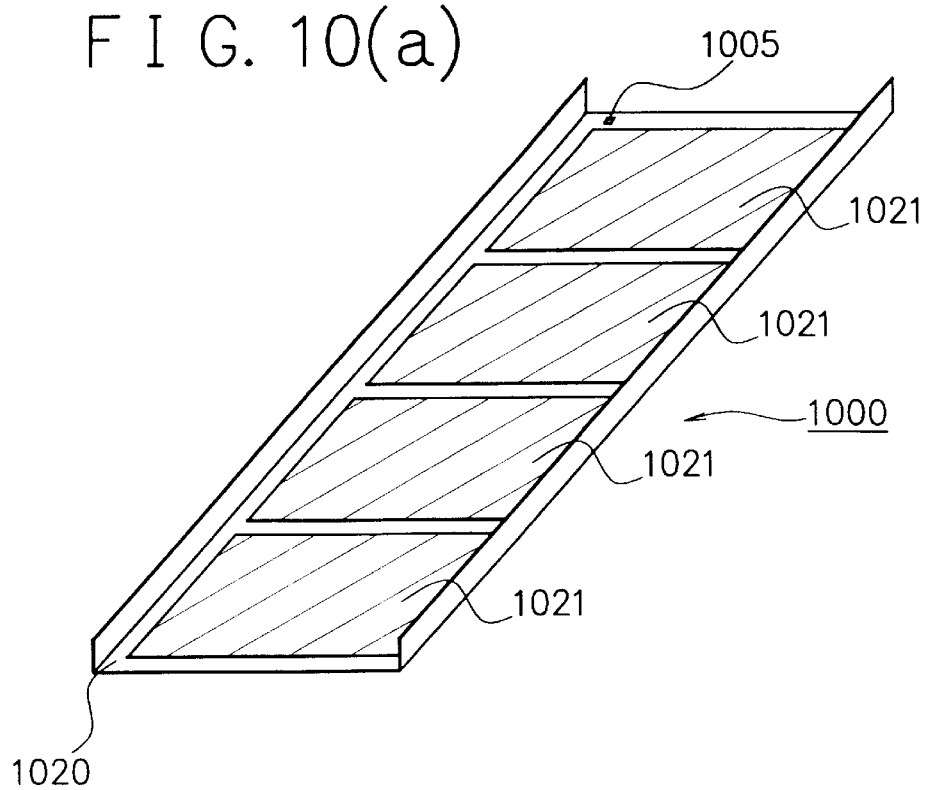
FIG. 10(a) is a schematic slant view illustrating a further example of a solar cell module according to the present invention, when viewed from the light receiving face side.
Figure 10B:
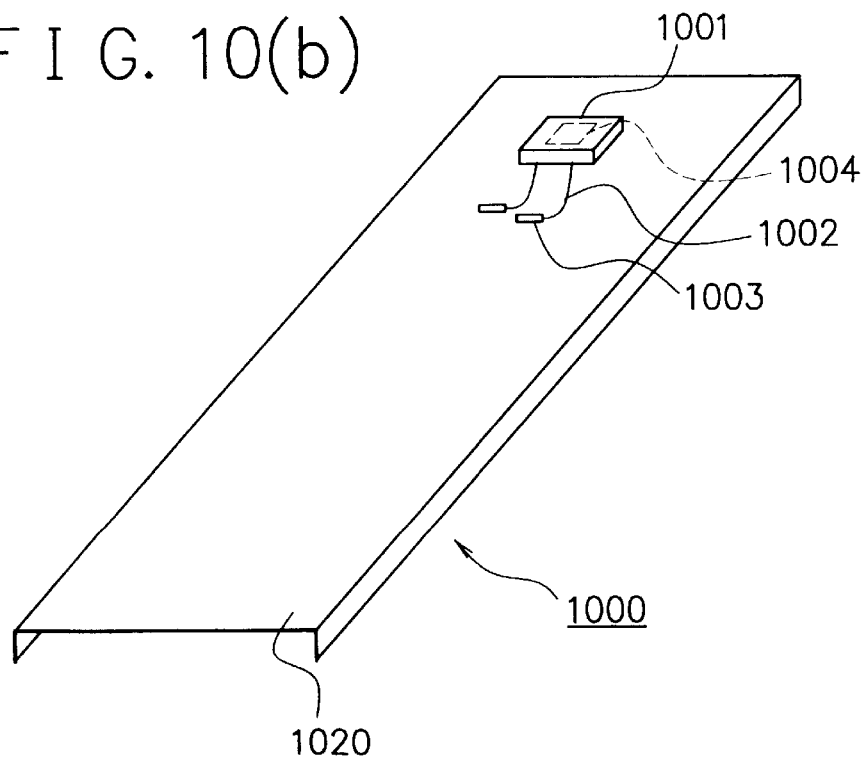
FIG. 10(b) is a schematic view of the solar cell module shown in FIG. 10(a), when viewed from the rear face side.

FIG. 10(a) is a schematic slant view illustrating an example of a solar cell module according to the present invention, when viewed from the light receiving face side. FIG. 10(b) is a schematic view of the solar cell module shown in FIG. 10(a), when viewed from the rear face side.

In FIGS. 10(a) and 10(b), reference numeral 1000 indicates the entirety of a solar cell module. The solar cell module 1000 comprises a plurality of solar cells 1021 spacedly arranged on a flat front face of a reinforcing member 1020 (a retaining member) whose opposite long edge side end portions are bent upward on the light receiving face side, where the solar cells 1021 are electrically connected with each other and sealed by a surface covering material (not shown) and a back face covering material (not shown). Each solar cell 1021 comprises a photovoltaic element group comprising a plurality of photovoltaic elements electrically connected with each other.

On the rear face of the reinforcing member 1020, there is also arranged a terminal box 1001 provided with a pair of power output cables 1002 each having a connector 1003. A pair of power output terminals extending from the solar cells electrically connected with each other are drawn through a hole (not shown) formed at a solar cell-free end portion of the reinforcing member 1020 in the longitudinal direction and connected to the terminal box 1001. The cables 1002 are electrically connected to said power output terminals in the terminal box 1001.

In this example, there is used a non-volatile readable and writable memory medium means comprising a memory medium main body 1004 arranged in the terminal box 1001 as shown in FIG. 10(b) and a power input-output means 1005 provided in the light receiving face of the solar cell module as shown in FIG. 10(a).

Specifically, the memory medium main body 1004 arranged in the terminal box 1001 comprises principal components of a non-volatile readable and writable memory medium. The power input-output means 1005 is provided at a solar cell-free portion (situated outside the power generation region) in the light receiving face of the solar cell module 1000. The power input-output means 1005 is electrically connected to the memory medium main body 1004 arranged in the terminal box 1001 through the above described hole (not shown) formed at the reinforcing member 1020.

Figure 11:
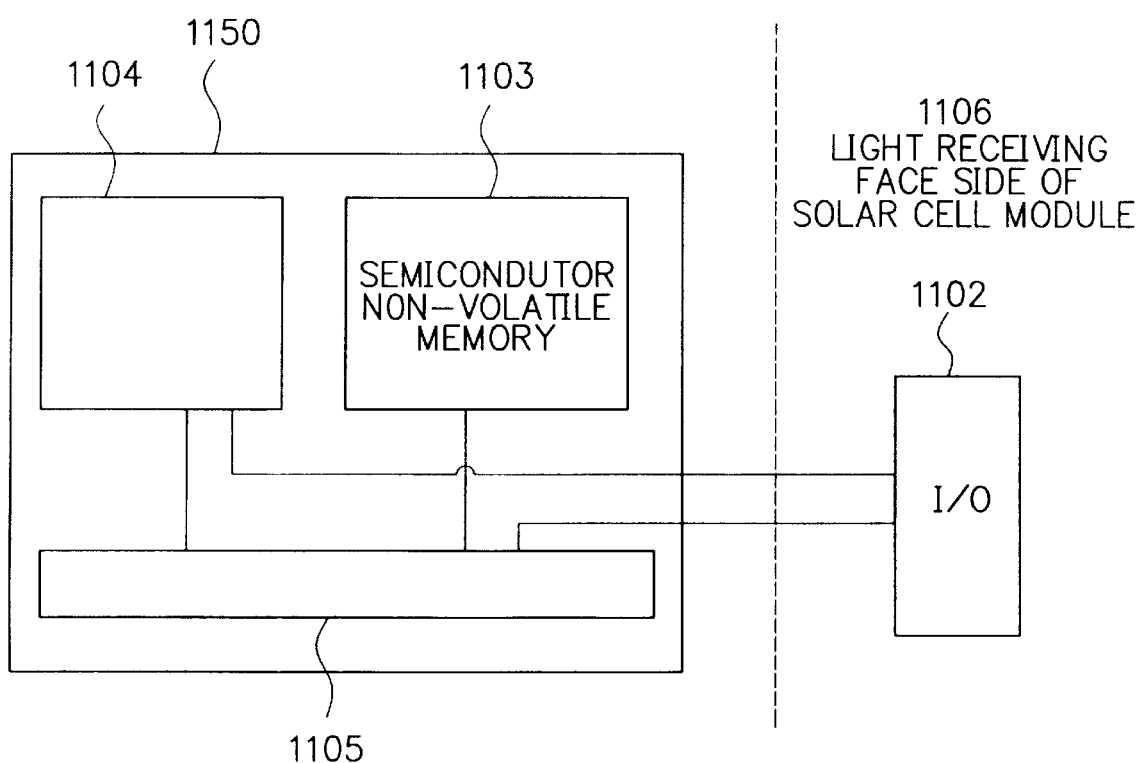
FIG. 11 is a schematic view illustrating an example of a non-volatile readable and writable memory means used in the solar cell module shown in FIGS. 10(a) and 10(b), in which a circuit having said memory means is shown.

The memory medium main body 1004 arranged in the terminal box 1001 as shown in FIG. 10(b) comprises a semiconductor non-volatile memory 1103, a power input-output means 1102, a control circuit 1105 for controlling these, and a power source 1104 as shown in FIG. 11. Reference numeral 1150 indicates a terminal box corresponding to the terminal box 1001 shown in FIG. 10(b).

Specifically, the semiconductor non-volatile memory 1103 comprises a flash memory. The power source 1104 comprises a coil power source utilizing a magnetoelectric effect. The power input-output means 1005 comprises a light emitting element for optical communication, an antenna, and a microcomputer for controlling these.

In the semiconductor non-volatile memory 1103 of the non-volatile readable and writable memory medium means provided in the solar cell module, related information is written as well as in Example 6. Such information includes, for example, types and administrative numbers of components constituting a solar cell module, production date and administrative number of the solar cell module, manufacturer of the solar cell module, production conditions of the solar cell module, and the like.

In the case of establishing a solar cell system, there is adopted, for example, such a manner as will be described in the following. That is, a plurality of solar cell modules having such configuration as above described are provided, and they are arranged on a given installation place while being electrically connected with each other in series connection or parallel connection, whereby a solar cell system is established on said installation place. After the establishment of the solar cell system, for instance, in the case where the surface of one of the solar cell modules constituting the solar cell system is damaged by flying matter due to heavy wind and the damaged solar cell module must be replaced by a new solar cell module, it is possible to readily obtain necessary information of the damaged solar cell module from the non-volatile readable and writable memory medium means provided therein without demolishing part of the solar cell system as in the prior art, in order to select new solar cell module, which corresponds to the solar cell module to be replaced.

Obtaining necessary information of the damaged solar cell module from the non-volatile memory medium means provided therein is readily accomplished, for instance, in the following manner. From the light receiving face side of the damaged solar cell module 1000, a magnetic-generating means (not shown) is brought close toward the coil power source 1104 of the memory medium main body arranged in the terminal box, where by virtue of an electric power generated by the coil power source 1104, the information memorized in the semiconductor non-volatile memory 1103 transmits through the power input-output means 1005 (comprising the light emitting element, antenna, and microcomputer), followed by being indicated in a specialized memory indication means (not shown). Besides, various information can be readily written in the semiconductor non-volatile memory of any of the solar cell modules constituting the solar cell system.

According to the constitution in this example, various information can be readily written in the non-volatile memory medium means of the solar cell module. In addition, even in the case of a solar cell system comprising a plurality of solar cell modules each having the foregoing non-volatile memory medium means and which is installed on an appropriate installation place, it is possible to obtain various information of any of the solar cell modules from the non-volatile memory medium means provided therein without demolishing part of the solar cell system as in the prior art. Similarly, additional information can be readily written in the non-volatile memory medium means of any of the solar cell modules constituting the solar cell system while maintaining the system as it is.

EXAMPLE 8

Figure 12A:
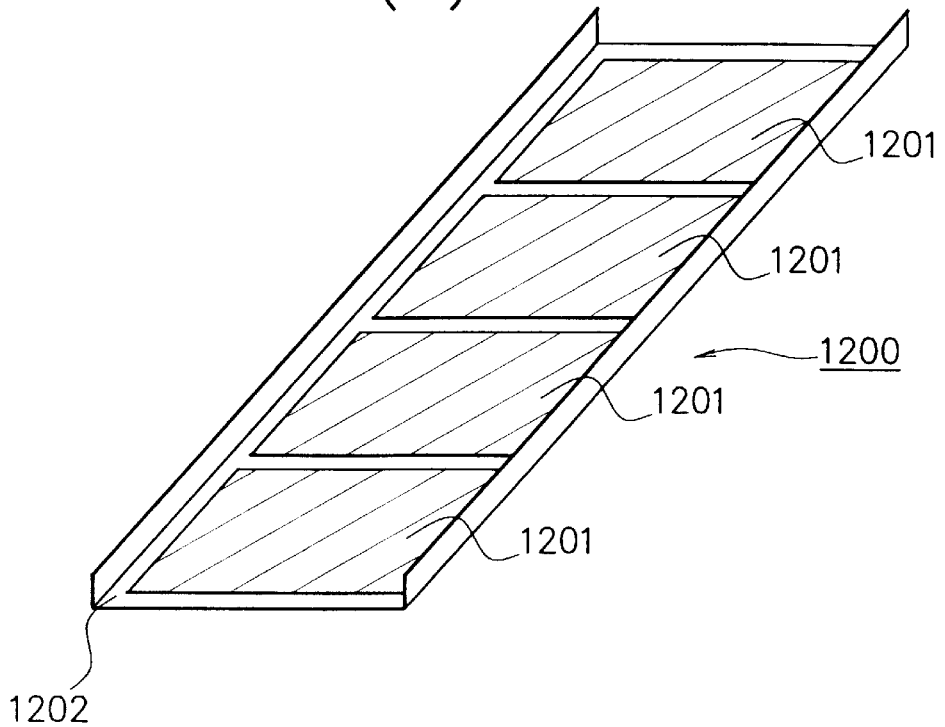
FIG. 12(a) is a schematic slant view illustrating a further example of a solar cell module according to the present invention, when viewed from the light receiving face side.
Figure 12B:
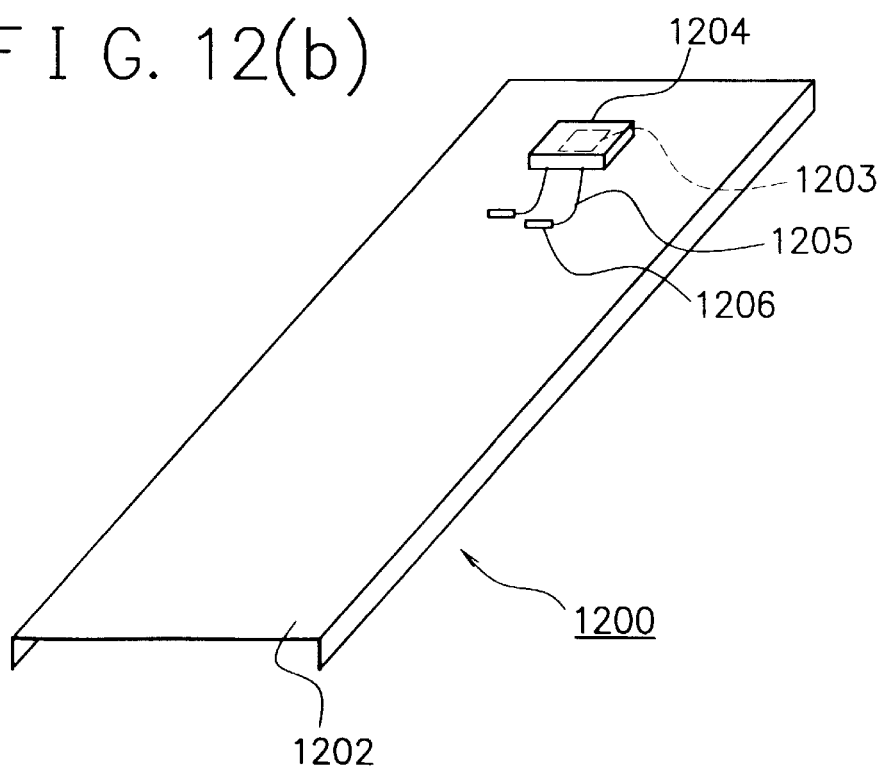
FIG. 12(b) is a schematic view of the solar cell module shown in FIG. 12(a), when viewed from the rear face side.

FIG. 12(a) is a schematic slant view illustrating an example of a solar cell module according to the present invention, when viewed from the light receiving face side. FIG. 12(b) is a schematic view of the solar cell module shown in FIG. 12(a), when viewed from the rear face side.

In FIGS. 12(a) and 12(b), reference numeral 1200 indicates the entirety of a solar cell module. The solar cell module 1200 comprises a plurality of solar cells 1201 spacedly arranged on a flat front face of a reinforcing member 1202 (a retaining member) whose opposite long edge side end portions are bent upward on the light receiving face side, where the solar cells 1201 are electrically connected with each other and sealed by a surface covering material (not shown) and a back face covering material (not shown). Each solar cell 1201 comprises a photovoltaic element group comprising a plurality of photovoltaic elements electrically connected with each other.

On the rear face of the reinforcing member 1202, there is arranged a terminal box 1204 provided with a pair of power output cables 1205 each having a connector 1206. A pair of power output terminals extending from the solar cells electrically connected with each other are drawn through a hole (not shown) formed at a solar cell-free end portion of the reinforcing member 1202 in the longitudinal direction and connected to the terminal box 1204. The cables 1205 are electrically connected to said power output terminals in the terminal box 1204.

In this example, there is used a non-volatile readable and writable memory medium means 1203 arranged in the terminal box 1204 as shown in FIG. 12(*b*). The non-volatile memory medium means 1203 arranged in the terminal box 1204 is operated using part of an electric power generated by the solar cell module 1200 as its operation power. And the non-volatile memory medium means 1203 is provided with a detector for detecting an output power of the solar cell module so that the output power of the solar cell module is periodically memorized in the non-volatile memory medium means 1203.

Figure 13:
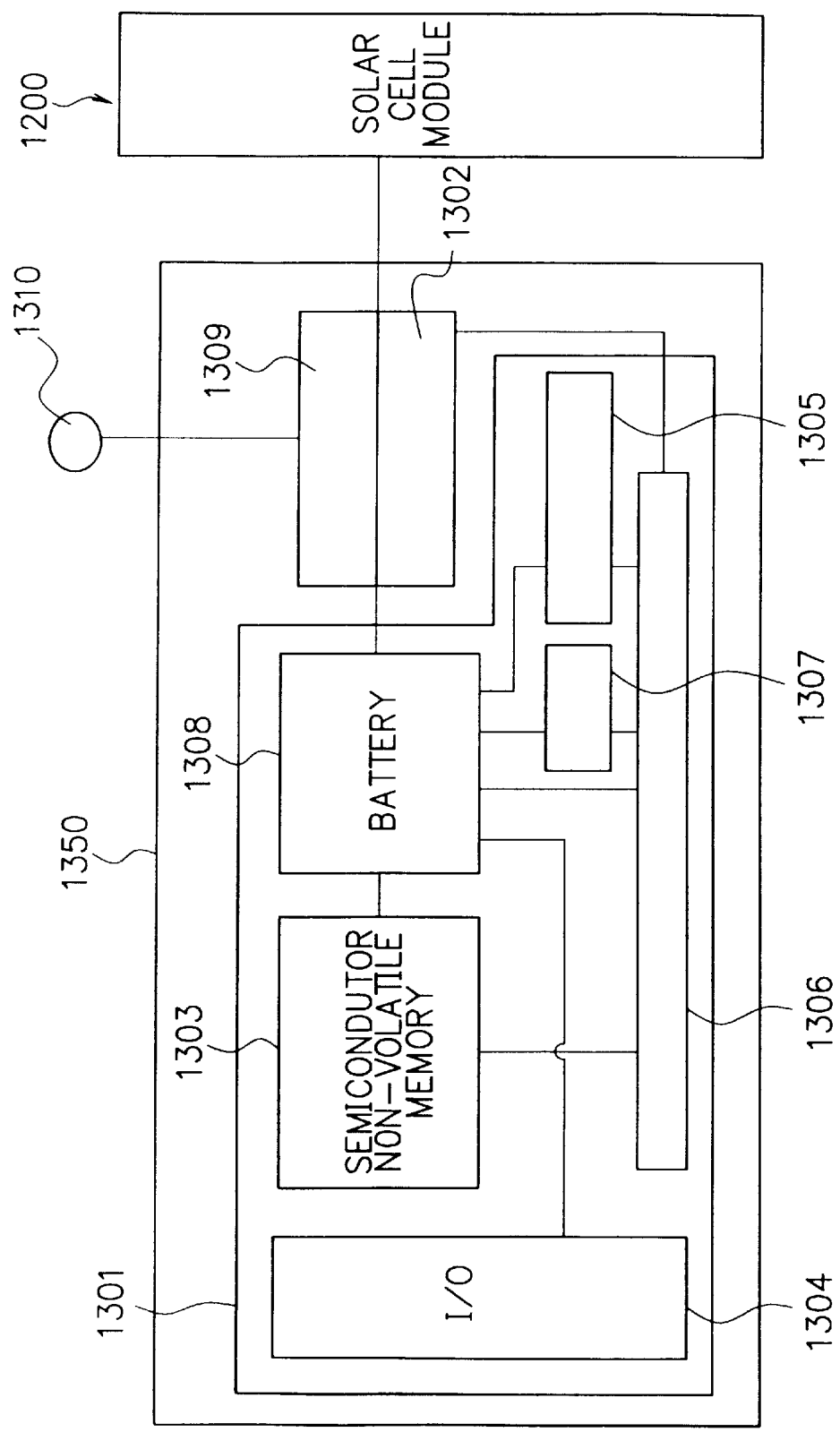
FIG. 13 is a schematic view illustrating an example of a non-volatile readable and writable memory means used in the solar cell module shown in FIGS. 12(a) and 12(b), in which a circuit having said memory means is shown.

The non-volatile memory medium means 1203 arranged in the terminal box 1204 as shown in FIG. 12(*b*) is configured as shown in FIG. 13. In FIG. 13, reference numeral 1350 indicates a terminal box corresponding to the terminal box 1203 shown in FIG. 12(*b*), and reference numeral 1301 indicates a non-volatile readable and writable memory medium means corresponding to the non-volatile memory medium means 1203 shown in FIG. 12(*b*).

Specifically, as shown in FIG. 13, the non-volatile memory medium means 1301 comprises a semiconductor non-volatile memory 1303, a power input-output means 1304, a temperature-detecting means 1305, a control circuit 1306 for controlling these, a timer 1307, and a storage battery 1308 which serves as a power source. The non-volatile memory medium means 1301 thus constituted is provided with an output power-detecting means 1302 for detecting an output power of the solar cell module 1200 and a power-dividing means 1309 for allotting part of an electric power generated by the solar cell module 1200 for charging in the storage battery 1308. Reference numeral 1310 indicates a power output terminal.

Specifically, the semiconductor non-volatile memory 1303 comprises a flash memory. The power input-output means 1304 comprises an antenna for magnetic communication. The output power-detecting means 1302 comprises a voltage-measuring device and a temperature-detecting means. The control circuit 1306 comprises a microcomputer. The storage battery 1308 comprises a rechargeable lithium battery. And the power-dividing means 1309 comprises a resistance circuit and a diode.

In the semiconductor non-volatile memory 1303 of the non-volatile readable and writable memory medium means provided in the solar cell module, related information is written as well as in Example 6. Such information includes, for example, types and administrative numbers of components constituting a solar cell module, production date and administrative number of the solar cell module, manufacturer of the solar cell module, production conditions of the solar cell module, and the like.

In the case of establishing a solar cell system, there is adopted, for example, such a manner as will be described in the following. That is, a plurality of solar cell modules having such configuration as above described is provided, and they are arranged on a given installation place while being electrically connected with each other in series connection or parallel connection, whereby a solar cell system is established on said installation place. After the establishment of the solar cell system, for instance, there will be an occasion in that one of the solar cell modules constituting the solar cell system is troubled thereby deteriorating an electric power outputted from the solar cell system, and the troubled solar cell module must be replaced by a new solar cell module.

In a conventional solar cell system, when such an above described situation occurs and the troubled solar cell module cannot be specified, it is necessary to demolish the solar cell system to examine all the constituent solar cell modules with respect to their performances to locate the troubled solar cell module.

However, for the solar cell system in this example, after the installation, data of the output power (voltage), the temperature and the like of each of the solar cell modules constituting the solar cell system are periodically memorized in the non-volatile memory medium means. Therefore, by ascertaining the operation (output power) records (memorized in the non-volatile memory medium means) of each solar cell module using a specialized reading means having a magnetic communication means, the troubled solar cell module can be readily located without demolishing the solar cell system.

Besides, various information can be readily written in the non-volatile memory medium means of any of the solar cell modules constituting the solar cell system.

Further, as described, because the operation history and the like of each solar cell module of the solar cell system are memorized in the non-volatile memory medium means, it is possible to readily obtain necessary information relating to the operation history and the like for any of the solar cell modules constituting the solar cell system by using a specialized communication means.

EXAMPLE 9

Figure 14A:
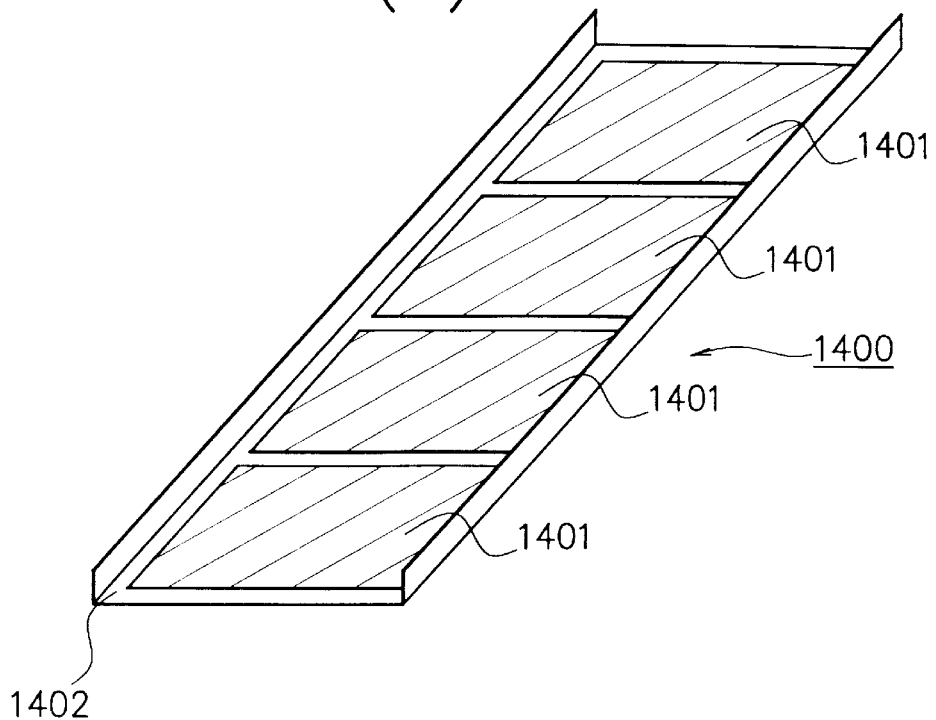
FIG. 14(a) is a schematic slant view illustrating a further example of a solar cell module according to the present invention, when viewed from the light receiving face side.
Figure 14B:
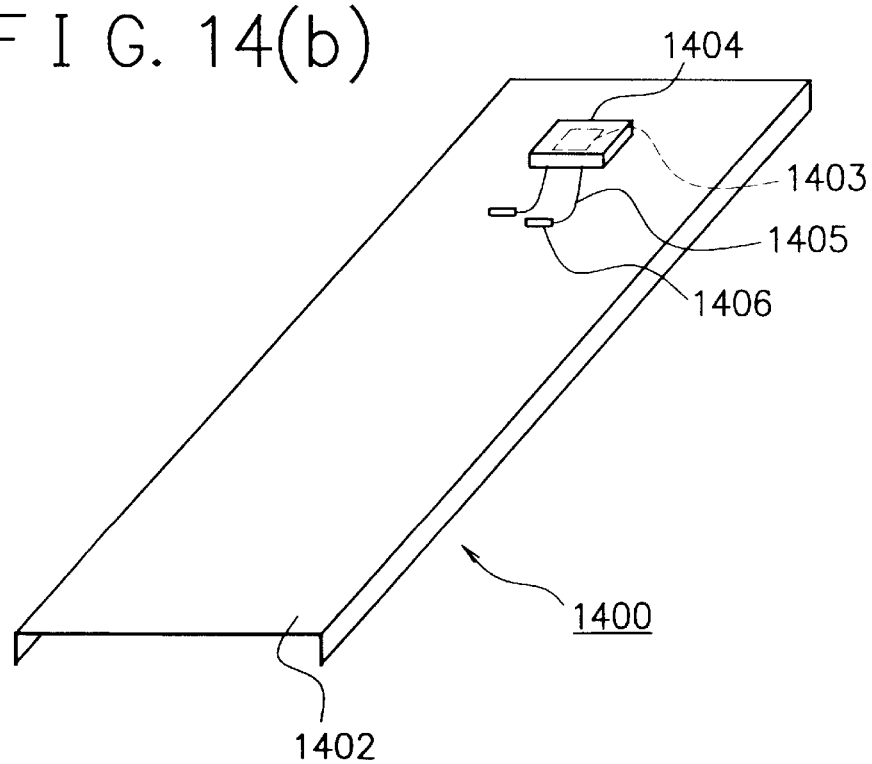
FIG. 14(b) is a schematic view of the solar cell module shown in FIG. 14(a), when viewed from the rear face side.
Figure 17A:
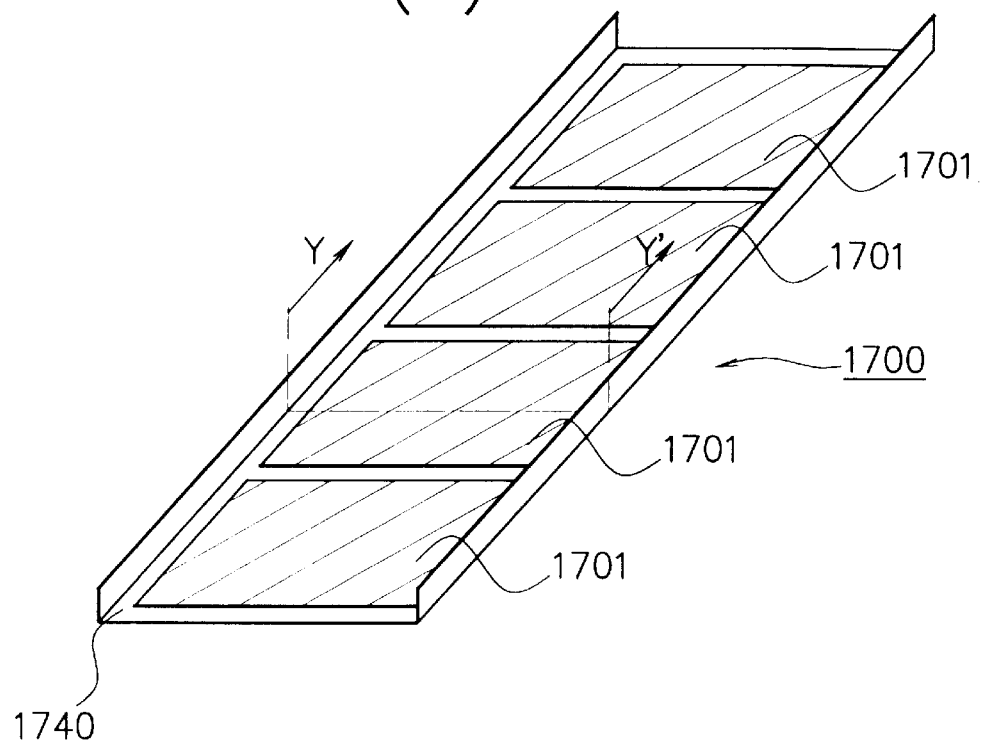
FIG. 17(a) is a schematic slant view illustrating an example of a conventional solar cell module, when viewed from the light receiving face side.
Figure 17B:
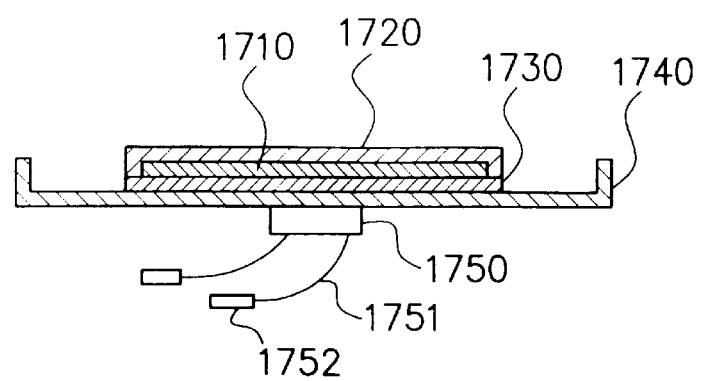
FIG. 17(b) is a schematic cross-sectional view, taken along the line Y-Y' in FIG. 17(a).
Figure 18:
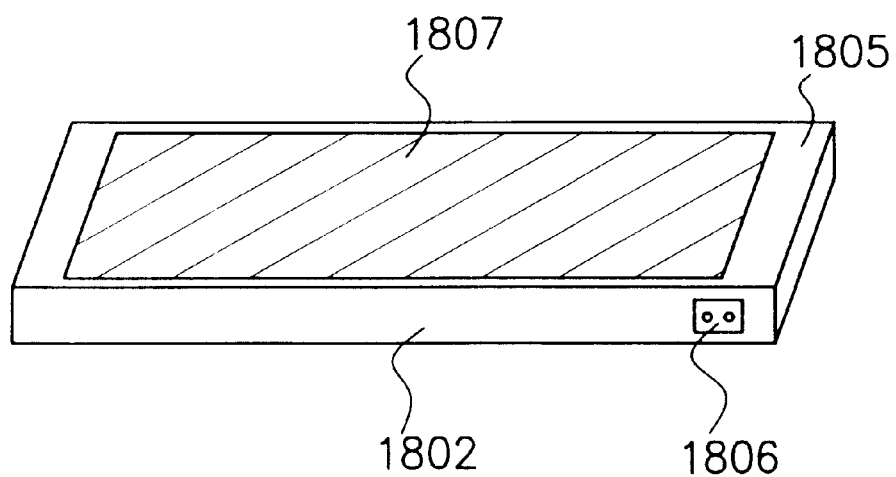
FIG. 18 is a schematic slant view illustrating an example of a conventional solar cell module which is provided with a face plate.

FIG. 14(*a*) is a schematic slant view illustrating an example of a solar cell module according to the present invention, when viewed from the light receiving face side. FIG. 14(*b*) is a schematic view of the solar cell module shown in FIG. 14(*a*), when viewed from the rear face side.

FIG. 15 is a schematic diagram illustrating an example of a circuit constitution of a non-volatile readable and writable memory medium means used in the solar cell module shown in FIGS. 14(*a*) and 14(*b*).

In FIGS. 14(*a*) and 14(*b*), reference numeral 1400 indicates the entirety of a solar cell module. The solar cell module 1400 comprises a plurality of solar cells 1401 spacedly arranged on a flat front face of a reinforcing member 1402 (a retaining member) whose opposite long edge side end portions are bent upward on the light receiving face side, where the solar cells 1401 are electrically connected with each other and sealed by a surface covering material (not shown) and a back face covering material (not shown). Each solar cell 1401 comprises a photovoltaic element group comprising a plurality of photovoltaic elements electrically connected with each other.

On the rear face of the reinforcing member 1402, there is arranged a terminal box 1404 provided with a pair of power output cables 1405 each having a connector 1406. A pair of power output terminals extending from the solar cells electrically connected with each other are drawn through a hole (not shown) formed at a solar cell-free end portion of the reinforcing member 1402 in the longitudinal direction and connected to the terminal box 1404. The cables 1405 are electrically connected to said power output terminals in the terminal box 1404.

In this example, there is used a non-volatile readable and writable memory medium means 1403 arranged in the terminal box 1404 as shown in FIG. 14(*b*). The non-volatile memory medium means 1403 arranged in the terminal box 1404 is operated using part of an electric power generated by the solar cell module 1400 as its operation power as well as in the case of Example 8. And the non-volatile memory medium means 1403 is provided with a detector for detecting an output power of the solar cell module so that the output power of the solar cell module is periodically memorized in the non-volatile memory medium means 1403. The non-volatile memory medium means 1403 in this example is provided with a power conversion means (indicated by reference numeral 1510 in FIG. 15) which serves to electrically connect the non-volatile memory medium means 1403 to the solar cell module main body 1400 by way of AC connection. This point distinguishes the non-volatile memory medium means 1403 in this example from the non-volatile memory medium means 1203 which is electrically connected to the solar cell module main body 1200 by way of DC connection in Example 8.

The non-volatile memory medium means 1403 arranged in the terminal box 1404 as shown in FIG. 14(*b*) is configured as shown in FIG. 15. In FIG. 15, reference numeral 1403 indicates a terminal box corresponding to the terminal box 1404 shown in FIG. 14(*b*), and reference numeral 1501 indicates a non-volatile readable and writable memory medium means corresponding to the non-volatile memory medium means 1403 shown in FIG. 14(*b*).

Specifically, as shown in FIG. 15, the non-volatile memory medium means 1501 comprises a semiconductor non-volatile memory 1503, a power input-output means 1504, a temperature-detecting means 1505, a control circuit 1506 for controlling these, a timer 1507, and a storage battery 1508 which serves as a power source. The non-volatile memory medium means 1501 thus constituted is provided with an output power-detecting means 1502 for detecting an output power of the solar cell module 1400, a power-dividing means 1509 for allotting part of an electric power generated by the solar cell module 1400 for charging in the storage battery 1508, and a power conversion means 1510. Reference numeral 1511 indicates a power output terminal. The non-volatile memory medium means 1501 having the semiconductor non-volatile memory 1503 is electrically connected to the solar cell module main body by way of AC connection through the power conversion means 1510 as above described.

As well as in the case of Example 8, the semiconductor non-volatile memory 1503 comprises a flash memory, the power input-output means 1504 comprises an antenna for magnetic communication, the output power-detecting means 1502 comprises a voltage-measuring device and a temperature-detecting means, the control circuit 1506 comprises a microcomputer, the storage battery 1508 comprises a rechargeable lithium battery, and the power-dividing means 1509 comprises a resistance circuit and a diode.

As well as in the case of Example 8, in the semiconductor non-volatile memory 1503 of the non-volatile readable and writable memory medium means provided in the solar cell module, related information is written. Such information includes, for example, types and administrative numbers of components constituting a solar cell module, production date and administrative number of the solar cell module, manufacturer of the solar cell module, production conditions of the solar cell module, and the like.

In the case of establishing a solar cell system, there is adopted, for example, such a manner as will be described in the following. That is, a plurality of solar cell modules having such configuration as above described is provided, and they are arranged on a given installation place while being electrically connected with each other in series connection or parallel connection, whereby a solar cell system is established on said installation place.

After the establishment of the solar cell system, for instance, there will be an occasion in that one of the solar cell modules constituting the solar cell system is troubled thereby deteriorating an electric power outputted from the solar cell system, and the troubled solar cell module must be replaced by a new solar cell module.

For the solar cell system in this example, after the installation, data of the output power (voltage), the temperature and the like of each of the solar cell modules constituting the solar cell system are periodically memorized in the non-volatile memory medium means. Therefore, by ascertaining the operation (output power) records (memorized in the non-volatile memory medium means) of each solar cell module using a specialized reading means having a magnetic communication means, the troubled solar cell module can be readily located without demolishing the solar cell system.

Besides, various information can be readily written in the non-volatile memory medium means of any of the solar cell modules constituting the solar cell system.

Further, as described, because the operation historiy and the like of each solar cell module of the solar cell system are memorized in the non-volatile memory medium means, it is possible to readily obtain necessary information relating to the operation history and the like for any of the solar cell modules constituting the solar cell system by using a specialized communication means.

As apparent from the above description, according to the present invention, a specific non-volatile readable and writable memory medium is provided in a solar cell module or a solar cell module string, where various data (information) of the solar cell module or the solar cell module string which are necessary for supervision can be readily written in the memory medium as desired, and upon supervising the solar cell module or the solar cell module string, necessary data (information) required for supervision can be readily obtained without referring to a database or the like. Hence, the supervision of the solar cell module or the solar cell module string can be readily performed.

What is claimed is:

1. A solar cell module having a light receiving face and a non-light receiving face and which is provided with a readable and writable memory medium capable of writing in a large quantity of information of said solar cell module and capable of reading out necessary information from said memory medium.

2. A solar cell module according to claim 1, wherein the memory medium comprises a non-volatile memory or a volatile memory in which an electric power is constantly supplied, and the solar cell module is provided with a power input-output means which electrically connects said non-volatile memory or said volatile memory to the outside.

3. A solar cell module according to claim 2, wherein the power input-output means is provided at a desired position in the light receiving face of the solar cell module.

4. A solar cell module according to claim 2, wherein the solar cell module is also provided with a power conversion means for converting an electric power generated by the solar cell module into an AC electric power and outputting said AC electric power, and the non-volatile memory or the volatile memory and the power input-output means are arranged in the power conversion means.

5. A solar cell module according to claim 2, wherein the solar cell module is also provided with a power conversion means for converting an electric power generated by the solar cell module into an AC electric power and outputting said AC electric power, and the non-volatile memory or the volatile memory, the control means and the power input-output means are arranged in said power conversion means.

6. A solar cell module according to claim 4 or 5, wherein the power conversion means comprises a module-integrated converter.

7. A solar cell module according to claim 1, wherein the memory medium comprises a non-volatile memory or a volatile memory in which an electric power is constantly supplied, and the solar cell module is provided with a control means for performing writing and reading for said non-volatile memory or said volatile memory and a power input-output means for performing delivery and receipt of data with respect to the outside.

8. A solar cell module according to claim 7, wherein the solar cell module is also provided with a means for supplying an electric power to drive the non-volatile memory or the volatile memory by dividing an electric power generated by the solar cell module.

9. A solar cell module according to claim 7, wherein the solar cell module is also provided with a storage battery for supplying an electric power to drive the non-volatile memory or the volatile memory.

10. A solar cell module according to claim 7, wherein the power input-output means is an optical power input-output means, a magnetic power input-output means or an electric power input-output means.

11. A solar cell module according to claim 7, wherein the solar cell module is also provided with a means for detecting information relating to an operation state or an operation environment of the solar cell module, and said information is written in the non-volatile memory or the volatile memory by means of the control means.

12. A solar cell module according to claim 11, wherein the information relating to the operation state includes information relating to optimum operating points of the solar cell module, and the information relating to the operation environment includes information relating to a quantity of solar radiation.

13. A solar cell module according to claim 1, wherein the memory medium is provided at a desired position in the non-light receiving face of the solar cell module.

14. A solar cell module according to claim 1 which is provided with a power conversion means for converting an electric power generated by the solar cell module into an AC electric power and outputting said AC electric power.

15. A solar cell module string comprising a plurality of solar cell modules defined in claim 1.

16. A solar cell system comprising a plurality of solar cell modules defined in claim 1.

17. A solar cell system according to claim 16, wherein the memory medium of each of the solar cell modules retains individual information of each solar cell module therein.

18. A solar cell module string which is provided with a readable and writable memory medium capable of writing in a large quantity of information of said solar cell module string and capable of reading out necessary information from said memory medium.

19. A solar cell module string according to claim 18, wherein the memory medium comprises a non-volatile memory or a volatile memory in which an electric power is constantly supplied, and the solar cell module string is provided with a control means for performing writing and reading for said non-volatile memory or said volatile memory and a power input-output means for performing delivery and receipt of data with respect to the outside.

20. A solar cell system comprising a solar cell module string defined in any of claims 15 to 19.

21. A supervising method for supervising a complete solar cell module, comprising disposing a readable and writable memory medium in said solar cell module, said memory medium being capable of writing and storing information therein and capable of reading out information therefrom; and supervising said solar cell module by writing administrative information of said solar cell module in said memory medium or reading necessary administrative information from said memory medium.

22. A supervising method according to claim 21, wherein delivery and receipt of necessary administrative information of the solar cell module are performed between the memory medium and an external database on-line or off-line.

23. A supervising method for supervising a complete solar cell module string, comprising disposing a readable and writable memory medium in said solar cell module string, said memory medium being capable of writing and storing information therein and capable of reading out information therefrom; and supervising said solar cell module string by writing administrative information of said solar cell module string in said memory medium or reading necessary administrative information from said memory medium.

24. A supervising method according to claim 23, wherein delivery and receipt of necessary administrative information of the solar cell module string are performed between the memory medium and an external database on-line or off-line.

25. A solar cell module having a solid semiconductor memory element.

26. A solar cell module string having a solid semiconductor memory element.

27. A solar cell module having a writable memory medium.

28. A solar cell module string having a writable memory medium.

29. A solar cell module having at least a non-volatile memory or a volatile memory.

30. A solar cell module string having at least a non-volatile memory or a volatile memory.

* * * * *

UNITED STATES PATENT AND TRADEMARK OFFICE
CERTIFICATE OF CORRECTION

PATENT NO. : 6,180,868 B1
DATED : January 30, 2001
INVENTOR(S) : Takehito Yoshino et al.

It is certified that error appears in the above-identified patent and that said Letters Patent is hereby corrected as shown below:

Title page,
Item [57], ABSTRACT,
Line 1, "module which" should read -- module reading --; and
Line 8, "string. A" should read -- string is provided, as well as a --.

Column 1,
Line 43, "above mentioned," should read -- above-mentioned, -- and
Line 45, "been" should be deleted.

Column 3,
Line 40, "above described" should read -- above-described --.

Column 5,
Line 32, "certatain" should read -- certain --.

Column 9,
Line 48, "medium," should read -- medium. --.

Column 10,
Line 57, "above described" should read -- above-described --.

Column 11,
Line 28, "a" should be deleted.

Column 13,
Line 1, "above described," should read -- described above, --.

Column 16,
Line 19, "above described," should read -- above-described, --; and
Line 27, "above described" should read -- above-described --.

UNITED STATES PATENT AND TRADEMARK OFFICE
CERTIFICATE OF CORRECTION

PATENT NO. : 6,180,868 B1
DATED : January 30, 2001
INVENTOR(S) : Takehito Yoshino et al.

It is certified that error appears in the above-identified patent and that said Letters Patent is hereby corrected as shown below:

Column 19,
Line 44, "a" should read -- a defect --.

Column 20,
Line 57, "above described" should read -- described above --.

Column 21,
Line 18, "is" should be deleted; and
Line 61, "above described" should read -- above-described --.

Column 24,
Line 37, "for" (second occurrence) should be deleted; and
Line 60, "DC" should read -- A DC --.

Column 25,
Line 46, "a right" should read -- an --.

Column 27,
Line 2, "which," should read -- wherein --;
Line 24, "trouble" should be deleted;
Line 25, "reason," should read -- reason for trouble --; and
Line 52,"above described," should read -- described above, --.

Column 29,
Line 42, "with" should be deleted.

Column 31,
Line 31, "above described," should read -- described above, --.

Column 34,
Line 50, "Thus,it" should read -- Thus, it --.

UNITED STATES PATENT AND TRADEMARK OFFICE
CERTIFICATE OF CORRECTION

PATENT NO. : 6,180,868 B1
DATED : January 30, 2001
INVENTOR(S) : Takehito Yoshino et al.

It is certified that error appears in the above-identified patent and that said Letters Patent is hereby corrected as shown below:

Column 37,
Line 66, "above" should read -- above --.

Column 39,
Line 60, "above described" should read -- described above --.

Column 40,
Line 18, "historiy" should read -- history --.

Signed and Sealed this

Eleventh Day of December, 2001

Attest:

NICHOLAS P. GODICI
Attesting Officer  Acting Director of the United States Patent and Trademark Office